(12) United States Patent
Yoshida et al.

(10) Patent No.: US 7,194,014 B2
(45) Date of Patent: Mar. 20, 2007

(54) SEMICONDUCTOR LASER DEVICE, SEMICONDUCTOR LASER MODULE, AND OPTICAL FIBER AMPLIFIER USING THE SEMICONDUCTOR LASER MODULE

(75) Inventors: Junji Yoshida, Tokyo (JP); Naoki Tsukiji, Tokyo (JP); Toshio Kimura, Tokyo (JP); Masashi Nakae, Tokyo (JP); Takeshi Aikiyo, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 330 days.

(21) Appl. No.: 10/748,159

(22) Filed: Dec. 31, 2003

(65) Prior Publication Data
US 2004/0240505 A1    Dec. 2, 2004

Related U.S. Application Data

(63) Continuation of application No. PCT/JP02/05791, filed on Jun. 11, 2002.

(30) Foreign Application Priority Data

| Jul. 2, 2001 | (JP) | ............................. 2001-201513 |
| Sep. 28, 2001 | (JP) | ............................. 2001-304435 |
| Oct. 23, 2001 | (JP) | ............................. 2001-325706 |
| Apr. 15, 2002 | (JP) | ............................. 2002-112643 |

(51) Int. Cl.
*H01S 5/00* (2006.01)
*H01S 3/14* (2006.01)

(52) U.S. Cl. ............................. 372/50.11; 372/50.12; 372/68

(58) Field of Classification Search ............. 372/50.11, 372/50.12
See application file for complete search history.

(56) References Cited

U.S. PATENT DOCUMENTS 5,291,571 A    3/1994  Kunikane et al.

(Continued)

FOREIGN PATENT DOCUMENTS

EP    0 312 652 A1    4/1989

(Continued)

OTHER PUBLICATIONS

Tatsuya Sasaki, et al., "Selective MOVPE Growth and Its Application to Semiconductor Photonic Integrated Circuits", Electronics and Communications in Japan, vol. 76, No. 4, XP 000420772, Apr. 1, 1993, pp. 1-11.

(Continued)

*Primary Examiner*—Armando Rodriguez
(74) *Attorney, Agent, or Firm*—Oblon, Spivak, McClelland, Maier & Neustadt, P.C.

(57) ABSTRACT

A semiconductor laser device having two active-layer stripe structures includes an n-InP substrate, an n-InP clad layer, a lower GRIN-SCH layer, an active layer, an upper GRIN-SCH layer, a p-InP clad layer, and a p-InGaAsP contact layer grown in this order, in a side cross section cut along one of the stripe structure. A high-reflection film is disposed on a reflection-side end surface, and a low-reflection film is disposed on an emission-side end surface. A p-side electrode is disposed on only a part of the upper surface of the p-InGaAsP contact layer so that a current non-injection area is formed on an area absent the p-side electrode.

7 Claims, 23 Drawing Sheets

U.S. PATENT DOCUMENTS

| | | | |
|---|---|---|---|
| 5,305,342 A | 4/1994 | Ota | |
| 5,465,263 A | 11/1995 | Bour et al. | |
| 6,384,963 B2 | 5/2002 | Ackerman et al. | |
| 6,782,028 B2 * | 8/2004 | Tsukiji et al. | 372/50.22 |

FOREIGN PATENT DOCUMENTS

| | | |
|---|---|---|
| EP | 0 742 617 A1 | 11/1996 |
| EP | 0 018 666 A1 | 7/2000 |
| JP | 02-260482 | 10/1990 |
| JP | 2001-402819 | 12/2001 |

OTHER PUBLICATIONS

M. Hussein Mourad, et al., "Design and simulation of a dual mode semiconductor laser using sampled grating DFB structure", IEE Proceedings: Optoelectronics, vol. 147, No. 1, XP 006014335, Feb. 15, 2000, pp. 37-42.

A. Talneau, et al., Multiple Distributed Feedback Operation At 1.55 μm With Uniform Output Powers in a Single Laser Diode, Applied Physics Letters, vol. 75, No. 5, Aug. 2, 1999, pp. 600-602.

Yoshihiro Emori et al., "Demonstration of Broadband Raman Amplifiers: A Promising Application of High-Power Pumping Unit" Furukawa Denko Giho, No. 105, Jan. 12, 2000, pp. 42-45.

* cited by examiner

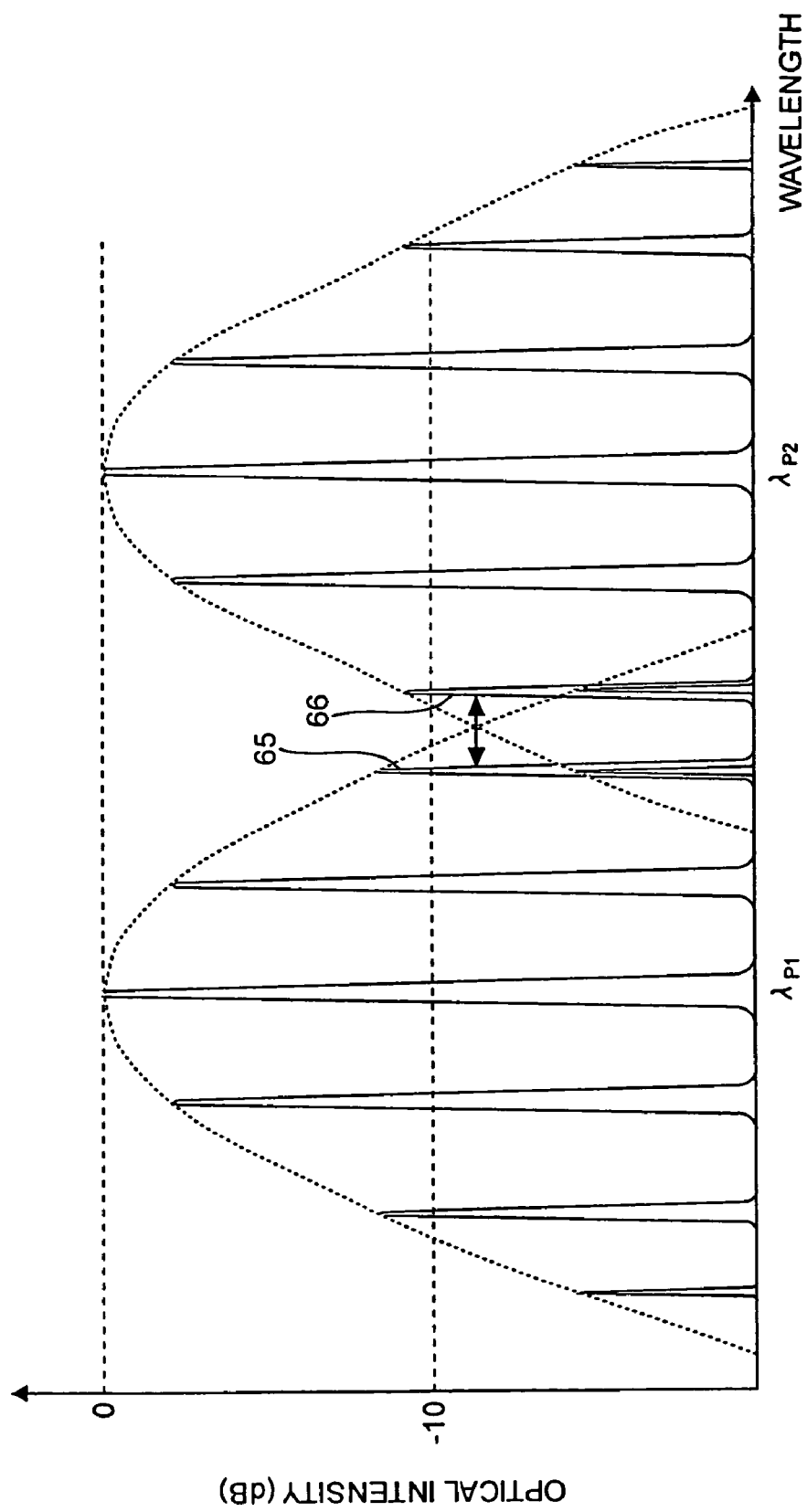

SEMICONDUCTOR LASER DEVICE, SEMICONDUCTOR LASER MODULE, AND OPTICAL FIBER AMPLIFIER USING THE SEMICONDUCTOR LASER MODULE

TECHNICAL FIELD

The present invention relates to a technology to reduce degree of polarization, produce little beat noise over a long distance, and exhibit a high power output in a semiconductor laser device, a semiconductor laser module, and an optical fiber amplifier.

BACKGROUND ART

In an optical fiber amplifier based on Raman amplification, it is possible to realize a high-gain optical fiber amplifier by using a high power pumping source employing a plurality of semiconductor laser devices. Since the Raman amplification of a signal light takes place when the polarization of the signal light and the polarization of a pump light are in correct matching, it is necessary to reduce the effect of polarization mismatching between the signal light and the pump light. To achieve this, degree of polarization (DOP) is reduced by eliminating the polarization of the pump light (i.e., depolarization of the pump light).

FIG. 26 is a block diagram of one example of a conventional Raman amplifier used in a WDM communication system. In FIG. 26, semiconductor laser modules 182a to 182d which include Fabry-Perot type semiconductor light-emitting elements 180a to 180d and fiber gratings 181a to 181d in corresponding pairs, output to polarization-combining couplers 161a and 161b laser beams to constitute the pump light. The semiconductor laser modules 182a and 182b output laser beams of the same wavelength. However, the polarization-combining coupler 161a combines the laser beams, aligned to have different polarization directions. Similarly, the semiconductor laser modules 182c and 182d output laser beams of the same wavelength. However, the polarization-combining coupler 161b combines the laser beams, aligned to have different polarization directions. The polarization-combining couplers 161a and 161b output the polarization-combined laser beams to the WDM coupler 162. The laser beams output from the polarization-combining couplers 161a and 161b have different wavelengths.

The WDM coupler 162 couples the laser beams output from the polarization-combining couplers 161a and 161b and outputs the coupled laser beam to an amplification fiber 164 as the pump light through an isolator 160 and a WDM coupler 165. The signal light to be amplified is input from a signal light input fiber 169 through an isolator 163 to the amplification fiber 164 to which the pump light is input, where the signal light is coupled with the pump light and Raman amplified.

The process of manufacturing the optical fiber amplifier will be complicated if the laser beams to be polarization-combined are emitted from stripe structures of different semiconductor elements. The size of the optical fiber amplifier also needs to be scaled up. Therefore, in order to solve these problems, a method of fabricating a Raman amplifier by using a semiconductor laser device that has two stripes on a single semiconductor substrate is proposed in Japanese Patent Laid-Open Publication No. 2001-402819. In this instance, it is possible to simplify the manufacturing process and to downsize the semiconductor laser device itself since a plurality of stripes is fabricated on the single substrate.

However, in the semiconductor laser device that has two stripes (hereinafter "W stripe laser device") as disclosed in the above Japanese Patent Laid-Open Publication, the two stripes arranged in parallel to each other are disposed extremely close to each other, with a spacing not more than 100 µm, or about 40 µm for instance, with a resonator formed by the common cleavage surface. The two stripes have almost the same physical structure and, hence, their resonator lengths are almost identical. Besides, due to proximity of the two stripes, the temperatures of their active layers are almost the same. Consequently, oscillation longitudinal mode wavelengths of the emitted laser beams, as well as a spacing of a plurality of oscillation longitudinal modes, are likely to coincide between the two stripes. If the oscillation longitudinal modes of the laser beams emitted from the different stripes overlaps, it is not possible any longer to reduce the DOP by polarization-combining the laser beams. This problem, though more conspicuous in a W stripe laser device, may occur even if the two stripes are disposed on different substrates. The phenomenon may be considered to occur because the overlapping of the oscillation longitudinal modes of the two laser beams that are polarization-combined may reduce the fluctuation of phase difference of the two oscillation longitudinal modes being combined, especially when the line width of the oscillation longitudinal modes are narrow, giving rise to a particular polarization state corresponding to the phase difference of the two modes in the combined laser beam.

Another problem arises due to overlapping of oscillation longitudinal modes of the laser beams that are polarization-combined. Normally, immediately after polarization-combining, the polarization components of the laser beams emitted from the two stripes do not interfere with each other. However, when RIN (relative intensity noise) for a laser beam propagated over a long distance is measured, a peak corresponding to a beat noise is observed in the vicinity of 11 GHz, as shown in FIG. 27, as a result of a mixing between the orthogonal polarization components during the long-distance transmission over the optical fiber. Since the Raman amplification in particular is a nonlinear process that takes place in an extremely short timescale, a noise that would develop as shown in FIG. 27 due to the beat noise when using the W stripe laser device as the pump light source, would be translated into the signal noise that would hamper the signal transmission.

Therefore, it is an object of the present invention to realize a semiconductor laser device and a semiconductor laser module which are suitable for an pump light source such as a Raman amplifier, and in which the degree of polarization is minimal and the beat noise, owing to long-distance transmission, does not occur, and an optical fiber amplifier using the semiconductor laser module, which enables a stable high-gain amplification independently of the polarization direction of the signal light.

DISCLOSURE OF THE INVENTION

It is an object of the present invention to solve at least the problems in the conventional technology.

The semiconductor laser device according to one aspect of the present invention includes a first stripe structure that has at least a first active layer grown on a first portion of a semiconductor substrate and a first electrode formed on the first active layer, and emits a first laser beam, a second stripe structure that has at least a second active layer grown on a second portion of the semiconductor substrate and a second electrode formed on the second active layer, and emits a second laser beam, and a non-current-injection area that is formed on a portion of an upper surface of the first stripe structure.

The semiconductor laser device according to another aspect of the present invention includes a first stripe structure that has at least a first active layer grown on a first portion of a semiconductor substrate and a first electrode formed on the first active layer, and emits a first laser beam, and a second stripe structure that has at least a second active layer grown on a second portion of the semiconductor substrate and a second electrode formed on the second active layer, and emits a second laser beam. A thermal conduction efficiency between the first active layer and the first electrode differs from a thermal conduction efficiency between the second active layer and the second electrode.

The semiconductor laser device according to still another aspect of the present invention includes a first active layer grown on a first portion of a semiconductor substrate, a first stripe structure that has a first diffraction grating formed in a vicinity of the first active layer, and emits a first laser beam having a plurality of longitudinal modes with a specific center wavelength, a second active layer grown on a second portion of the semiconductor substrate, and a second stripe structure that has a second diffraction grating formed in a vicinity of the second active layer, and emits a second laser beam having a plurality of longitudinal modes with a specific center wavelength. The center wavelength selected by the first diffraction grating differs from the center wavelength selected by the second diffraction grating.

The semiconductor laser device according to still another aspect of the present invention includes a first stripe structure that has a first active layer grown on a first portion of a semiconductor substrate and a first diffraction grating formed in a vicinity of the first active layer, which selects a first laser beam having a plurality of longitudinal modes with a specific center wavelength, and a second stripe structure that has a second active layer grown on a second portion of the semiconductor substrate and a second diffraction grating formed in a vicinity of the second active layer, which selects a second laser beam having a plurality of longitudinal modes with a specific center wavelength. A difference between the center wavelength of the first laser beam and the center wavelength of the second laser beam is not less than 0.5 times a mode spacing of either of the first laser beam and the second laser beam.

The semiconductor laser device according to still another aspect of the present invention includes a first stripe structure that has a first active layer grown on a first portion of a semiconductor substrate and a first diffraction grating formed in a vicinity of the first active layer, which selects a first laser beam having a plurality of longitudinal modes with a specific center wavelength, and a second stripe structure that has a second active layer grown on a second portion of the semiconductor substrate and a second diffraction grating formed in a vicinity of the second active layer, which selects a second laser beam having a plurality of longitudinal modes with a specific center wavelength. A difference between a peak wavelength of the first laser beam and a peak wavelength of the second laser beam is not less than 0.01 nanometers.

The semiconductor laser device according to still another aspect of the present invention includes a first stripe structure that has a first active layer grown on a first portion of a semiconductor substrate and a first diffraction grating formed in a vicinity of the first active layer, which selects a first laser beam having a plurality of longitudinal modes with a specific center wavelength, and a second stripe structure that has a second active layer grown on a second portion of the semiconductor substrate and a second diffraction grating formed in a vicinity of the second active layer, which selects a second laser beam having a plurality of longitudinal modes with a specific center wavelength. A difference between wavelengths of all the oscillation longitudinal modes that have a difference of not more than 3 dB with respect to a peak power of the first laser beam and wavelengths of all the oscillation longitudinal modes that have a difference of not more than 3 dB with respect to a peak power of the second laser beam is not less than 0.01 nanometers.

The semiconductor laser module according to still another aspect of the present invention includes a semiconductor laser device according to the present invention, a first lens into which the first laser beam and the second laser beam are incident, a polarization rotating unit into which either of the first laser beam and the second laser beam that have passed through the first lens is incident, and rotates the polarization plane of the incident laser beam by a predetermined angle, a polarization-combining unit which has a first port to which the first laser beam is incident from either of the first lens and the polarization rotating unit, a second port to which the second laser beam is incident from either of the first lens and the polarization rotating unit, and a third port that combines the first laser beam and the second laser beam, and an optical fiber that receives a laser beam output from the third port of the polarization-combining unit, and transmits the laser beam to outside.

The optical fiber amplifier according to still another aspect of the present invention includes a pump light source that employs a semiconductor laser device according to the present invention or a semiconductor laser module according to the present invention, an optical coupler that couples a signal light with a pump light, and an amplification optical fiber that amplifies a light based on a Raman amplification.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 18 illustrates oscillation spectral waveforms of two laser beams by which the beat noise frequency range becomes out of the frequency range of an optical transmission system;

FIG. 24B is a perspective view of the holder supported by a second supporting member;

BEST MODE FOR CARRYING OUT THE INVENTION

Figure 1:
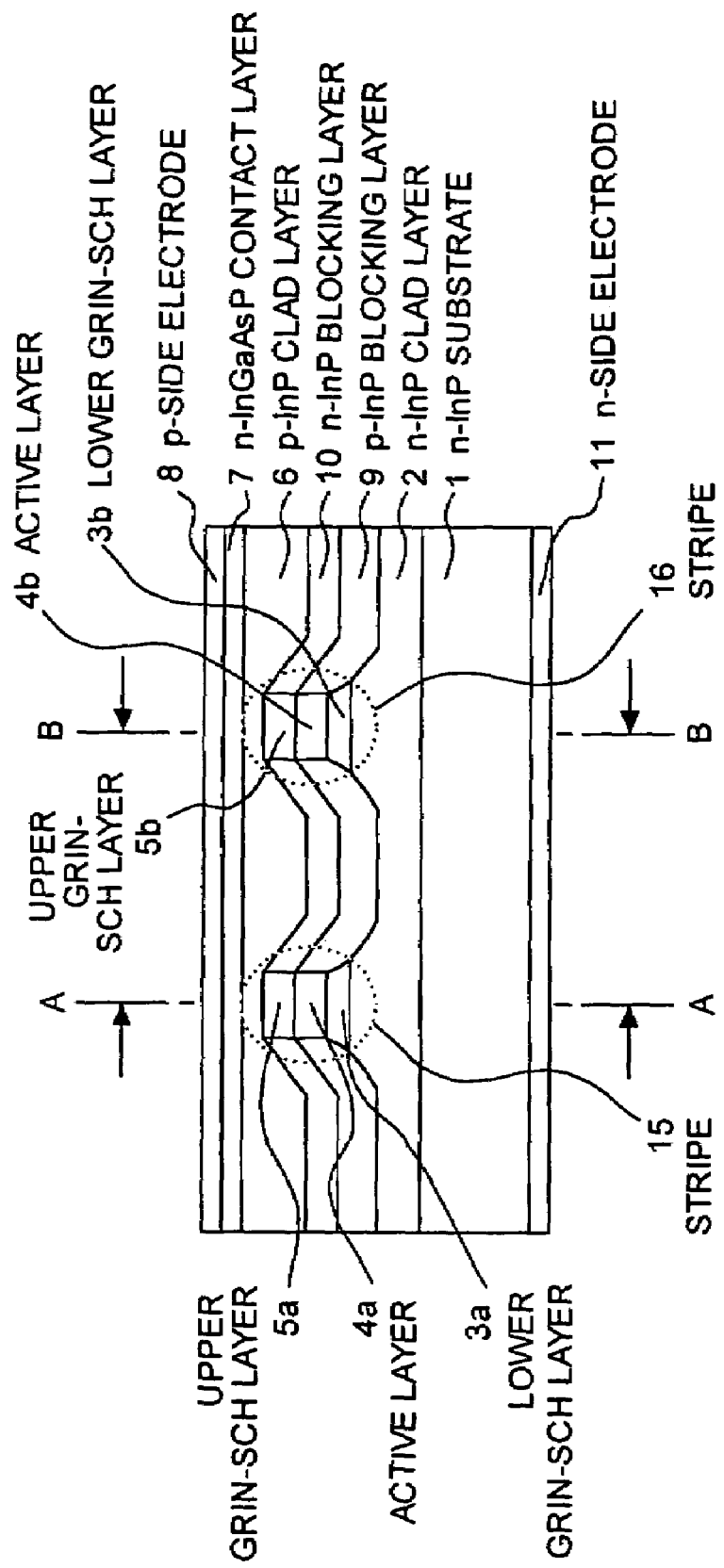
FIG. 1 is a front cross-section of a semiconductor laser device according to a first embodiment of the present invention.

Exemplary embodiments of a semiconductor laser device, a semiconductor laser module, and an optical fiber amplifier using the semiconductor laser module according to the present invention will be explained with reference to the accompanying drawings. Identical or similar parts are assigned identical or similar reference numerals or symbols. It should be noted that the drawings are schematic, and the relationship between the thickness and the width of a layer, and ratios of thickness of layers are different from actual ones. Further, not all parts in the drawings are drawn to scale.

Figure 2:
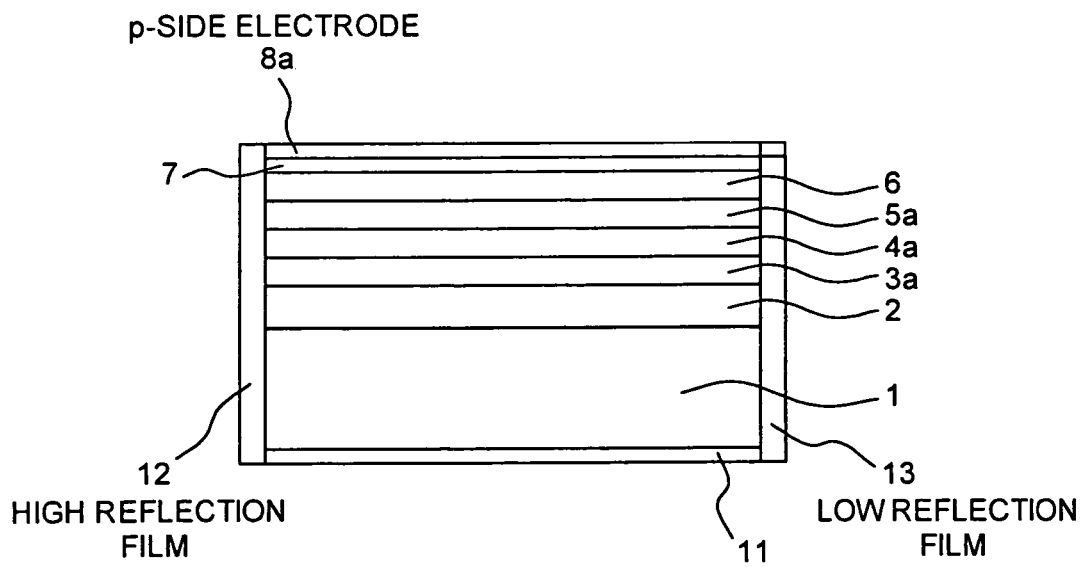
FIG. 2 is a cross-section of the semiconductor laser device shown in FIG. 1 cut along the line A—A.
Figure 3:
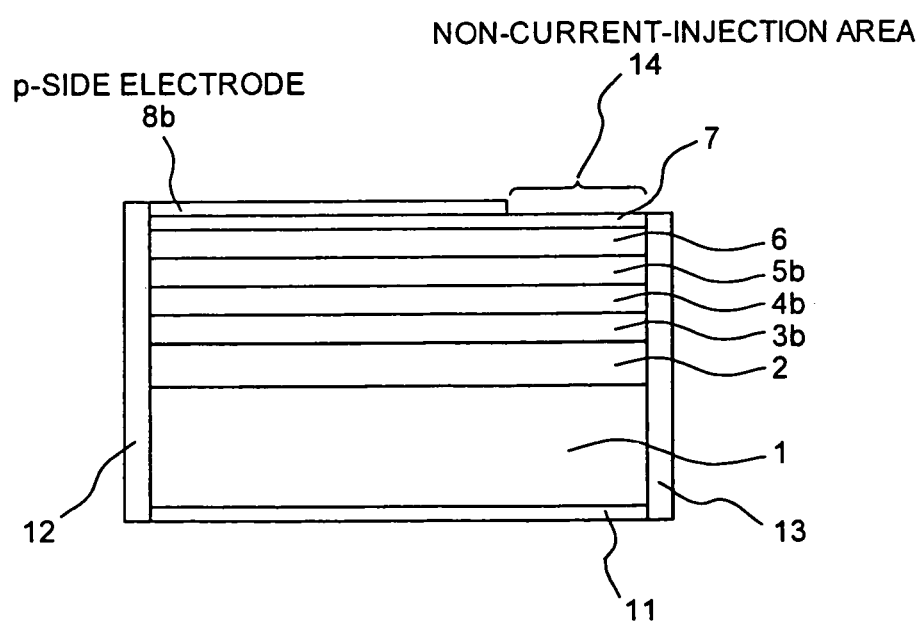
FIG. 3 is a cross-section of the semiconductor laser device shown in FIG. 1 cut along the line B—B.

A semiconductor laser device according to a first embodiment of the present invention will be described below. FIG. 1 is a front cross-section showing a structure of the semiconductor laser device according to the first embodiment of the present invention. FIG. 2 is a cross-section of the semiconductor laser device shown in FIG. 1 cut along the line A—A. FIG. 3 is a cross-section of the semiconductor laser device shown in FIG. 1 cut along the line B—B.

As shown in FIG. 1, the semiconductor laser device according to the first embodiment has an n-InP clad layer 2 deposited on an n-InP substrate 1. On the A—A line shown in FIG. 1, a lower GRIN-SCH (Graded Index-Separate Confinement Heterostructure) layer 3a, an active layer 4a, and an upper GRIN-SCH layer 5a are deposited in a mesa shape. These will be collectively called a stripe 15. Similarly, on the B—B line, a lower GRIN-SCH layer 3b, an active layer 4b, and an upper GRIN-SCH layer 5b are deposited in a mesa shape. These will be collectively called a stripe 16. The stripe 15 and the stripe 16 are separated by a space between them. At the portions excluding the stripe 15 and the stripe 16, a p-InP blocking layer 9 and an n-InP blocking layer 10 are deposited sequentially on the n-InP clad layer 2 to form a structure such that an injection current flows only into the stripe 15 and the stripe 16. Further a p-InP clad layer 6 is deposited on the upper GRIN-SCH layers 5a and 5b and the n-InP blocking layer 10. A p-InGaAsP contact layer 7 and p-side electrode are sequentially deposited on the p-InP clad layer 6. An n-side electrode 11 is disposed on the lower surface of the n-InP substrate 1.

The n-InP clad layer 2 achieves a function of a buffer layer as well as that of a clad layer. The semiconductor laser device according to the first embodiment has a double-hetero structure formed by sandwiching the stripe 15 and the stripe 16 with the n-InP clad layer 2 and p-InP clad layer 6, which enables effective confinement of carriers and high light-emission efficiency.

The active layers 4a and 4b employ, for example, a compressive strain quantum well structure of a lattice mismatching ratio within a range of 0.5% to 1.5% to the n-InP substrate 1. This structure is advantageous from the viewpoint of a high output. If the strain quantum well structure employs a strain compensation structure having a barrier layer formed with a tensile stain opposite to a strain of the well layer, it is possible to equivalently meet a lattice matching condition. Therefore, it is not necessary to provide an upper limit to a lattice mismatching ratio of the well layer. In this case, a compressive quantum well having five wells and a lattice mismatching ratio of 1% is used.

The stripe 15 consists of a deposited structure of the lower GRIN-SCH layer 3a, the active layer 4a, and the upper GRIN-SCH layer 5a, thereby forming what is called a GRIN-SCH-MQW (Graded Index-Separate Confinement Heterostructure-Multiple Quantum Well) active layer. Based on this structure, it becomes possible to confine carriers more effectively. Therefore, combined with the double-hetero structure, the semiconductor laser device according to the first embodiment has high light emission efficiency. This similarly applies to the stripe 16.as well.

FIG. 2 shows the structure of the cross-section of the semiconductor laser device cut along the line A—A. A low reflection film 13 is disposed on the entire surface of an emission-side end surface (the right-side end surface in FIG. 2), and a high reflection film 12 is disposed on the entire surface of a reflection-side end surface (the left-side end surface in FIG. 2). A p-side electrode 8*a* is disposed on the entire surface of the p-InGaAsP contact layer 7.

The high reflection film 12 has a light reflectivity of 80% or above, preferably 98% or above. On the other hand, the low reflection film consists of a film structure of a low reflectivity, having a light reflectivity of not more than 5%, preferably about 1%.

FIG. 3 shows the structure of the semiconductor laser device appearing in the cross-section cut along the line B—B. The low reflection film 13 is disposed on the emission-side end surface, and the high reflection film 12 is disposed on the reflection-side end surface, in a similar manner to the structure appearing in the A—A cross-section. A p-side electrode 8*b* is disposed on the surface of the p-InGaAsP contact layer 7 excluding a portion of this surface. Each stripe shown in FIG. 2 and FIG. 3 has a resonator length of 800 μm to 3200 μm.

In the semiconductor laser device according to the first embodiment, a current is injected from the p-side electrode 8, and a light-emission recombination of carriers occurs in the stripe 15 and the stripe 16. A light generated in this process is amplified in a resonator formed by the high reflection film 12 and the low reflection film 13 through a stimulated emission, and a laser beam is emitted from the low reflection film 13.

In the semiconductor laser device according to the first embodiment, effective resonator lengths are different for the stripe 15 and the stripe 16. That is, since the p-side electrode 8*a* of the stripe 15 is disposed on the whole surface of the p-InGaAsP contact layer 7 as shown in FIG. 2, while the p-side electrode 8*b* of the stripe 16 is disposed only on a part of and not on the entire surface of the p-InGaAsP contact layer 7 as shown in FIG. 3, the current injected to carry out a laser oscillation flows only to the portion below the p-side electrode 8*b* in the stripe 16, and not to the portion below the region where p-side electrode 8*b* is not present.

A refractive index of a semiconductor single-crystal varies based on a current that flows inside the single-crystal. Therefore, in the semiconductor laser device according to the first embodiment, the refractive index of the semiconductor single-crystal that constitutes the stripe 15 and the stripe 16 varies because of the existence of the injection current at the time of laser oscillation.

In the semiconductor laser device according to the first embodiment, the injection current flows into the whole of the stripe 15, but does not flow into a portion of the stripe 16. Therefore, the refractive index varies over the whole length of the semiconductor single crystal that constitutes the stripe 15. However, in the stripe 16, there occurs no variation in the refractive index in the portion where no current flows. Consequently, the optical path length, taking into account the refractive index, are different between the stripe 15 and the stripe 16, although their physical resonator lengths are the same. Since the oscillation longitudinal mode wavelength and their spacing of the semiconductor laser device are determined based on an effective resonator length that takes into account the refractive index, the oscillation longitudinal mode wavelength and the oscillation longitudinal mode spacing of laser beams that are oscillated from the stripe 15 and the stripe 16 of the semiconductor laser device according to the first embodiment are different correspondingly to the difference in the optical path lengths.

A semiconductor laser device having a conventional W stripe structure is structured in such a way that the physical resonator lengths of the stripes are equal, and the injection current flows uniformly into each stripe. Therefore, the oscillation longitudinal mode wavelengths of the laser beams emitted from the stripes are completely identical. On the other hand, in the semiconductor laser device according to the first embodiment, the oscillation longitudinal mode wavelength of the laser beam emitted from the stripe 15 and the oscillation longitudinal mode wavelength of the laser beam emitted from the stripe 16 are different from each other, though slightly. Hence, in the semiconductor laser device according to the first embodiment, unlike in the semiconductor laser device having a conventional W stripe structure, the overlapping of the two oscillation longitudinal modes is suppressed and the DOP can be reduced.

In the semiconductor laser device according to the first embodiment, the stripe 15 and the stripe 16 have the same structure except for p-side electrodes 8*a* and 8*b*. Therefore, the semiconductor laser device according to the first embodiment is easy to manufacture. That is, the semiconductor laser device according to the first embodiment of the present invention can be manufactured by the manufacturing method which differs from that of the conventional semiconductor laser device only in that the electrode is not formed in the area where the non-current-injection area 14 is to be provided, with the other processes in the method being completely identical to the conventional ones. Therefore, it is another advantage of the semiconductor laser device according to the present invention that it can be easily manufactured using a conventional manufacturing apparatus. Note that a contact layer in the non-current-injection area 14 should preferably be eliminated in order to ensure the prevention of diffusion of current to this area.

Figure 4:
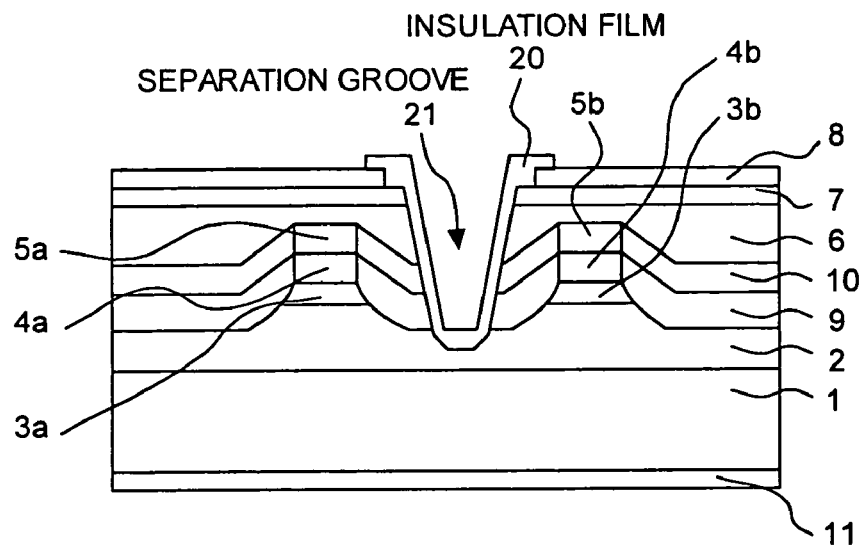
FIG. 4 is a front cross-section of a modification of the semiconductor laser device according to the first embodiment.

A modification of the semiconductor laser device according to the first embodiment will be explained next. FIG. 4 is a front cross-section showing a structure of a modification of the semiconductor laser device according to the first embodiment. In this modification, a separation groove 21 is formed between the stripe 15 and the stripe 16, which reaches to a depth of the n-InP contact layer 2 from the p-side electrode 8. The stripe 15 and the stripe 16 can be electrically separated by covering the surface of the separation groove 21 with an insulation film 20. With this semiconductor laser device used as a pump light source for the Raman amplifier, the injection current supplied to the two stripes can be independently controlled so that it becomes much easier to reduce the DOP of the polarization-combined laser beam.

While in the first embodiment, the explanation has been given to the semiconductor laser device of the Fabry-Perot type, it is also possible to apply the above structure to a semiconductor laser device that has a wavelength selecting means like DFB or DBR. Such type of semiconductor laser device, if used as a pump light source for the Raman amplifier, would make it possible to obtain an optical output of stabilized oscillation wavelength even without a fiber grating for wavelength selection.

Further, in the semiconductor laser device according to the first embodiment, a non-current-injection area 14 is provided only in the stripe 16. However, the non-current-injection area 14 may be provided in both the stripe 15 and the stripe 16. In this case, by providing different surface areas of the non-current-injection area in the two stripes, the amount of injected current to the stripe 15 and the stripe 16 can be made different from each other, whereby it is possible to obtain laser beams of different wavelengths.

Next, a semiconductor laser device according to a second embodiment of the present invention will be described below. In a semiconductor laser device according to the second embodiment of the present invention, parts that are assigned the same reference numerals or symbols as those in the first embodiment have similar structures and functions to those of the corresponding parts of the first embodiment. Therefore, their explanation will be omitted.

Figure 5:
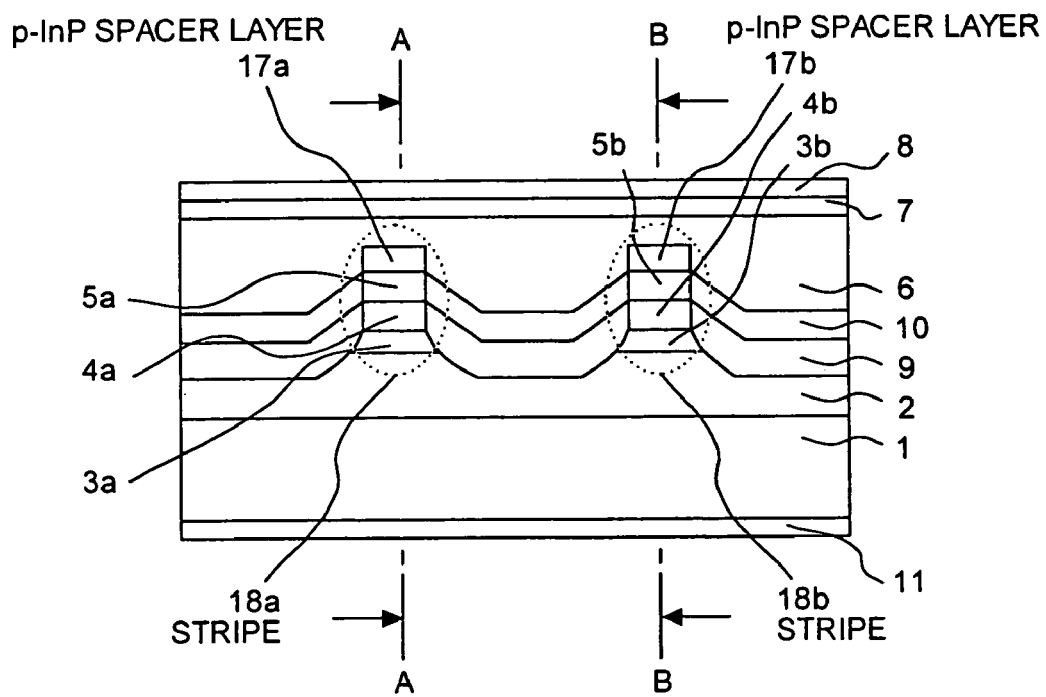
FIG. 5 is a front cross-section of a semiconductor laser device according to a second embodiment of the present invention.

FIG. 5 is a front cross-section showing a structure of a semiconductor laser device according to the second embodiment. As shown in FIG. 5, in the semiconductor laser device according to the second embodiment, a stripe 18a has a p-InP spacer layer 17a deposited on an upper GRIN-SCH layer 5a, and a stripe 18b has a p-InP spacer layer 17b deposited on an upper GRIN-SCH layer 5b.

Figure 6A:
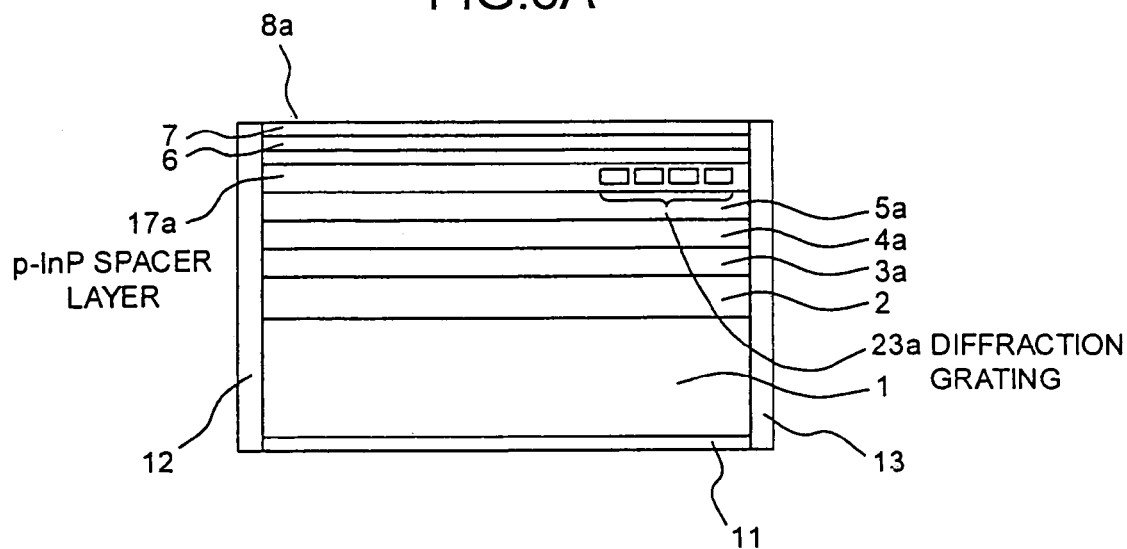
FIG. 6A and FIG. 6B are cross-sections of the semiconductor laser device shown in FIG. 5 cut along the line A—A and the line B—B, respectively.
Figure 6B:
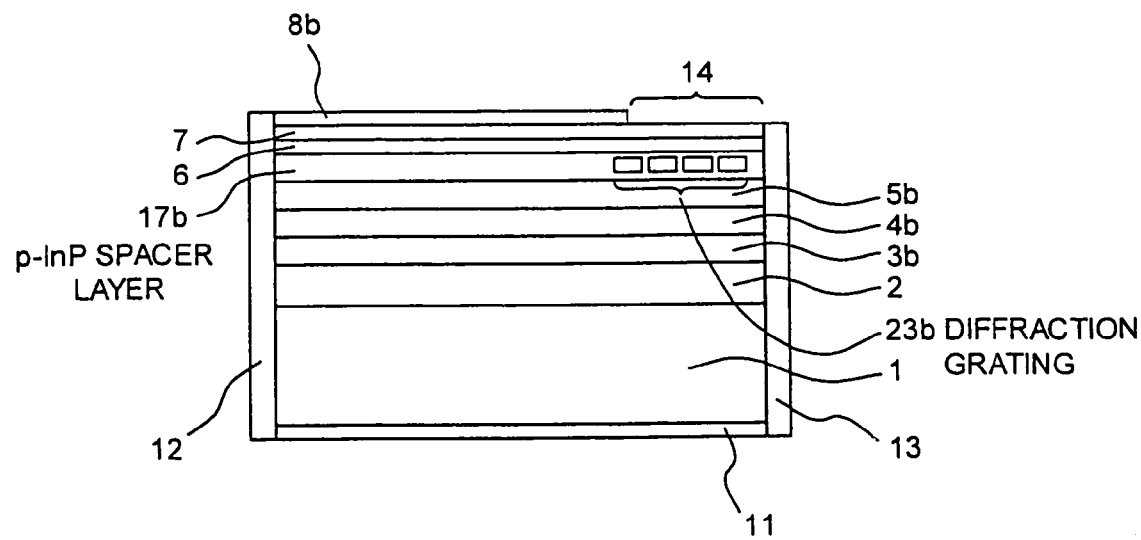

FIG. 6A is a cross-section of the semiconductor laser device shown in FIG. 5 cut along the line A—A. As shown in this drawing, the semiconductor laser device according to the second embodiment has a structure in which a diffraction grating 23a is disposed in a part of the area within the p-InP spacer layer 17a. FIG. 6B is a cross-section of the semiconductor laser device shown in FIG. 5 cut along the line B—B, which shows that a diffraction grating 23b is disposed in a part of the area within the p-InP spacer layer 17b.

These diffraction grating 23a and 23b are made of p-InGaAsP. Each diffraction grating has a film thickness of 20 nm, and a length of 50 μm in a laser emission direction (i.e. the lateral direction in FIG. 6A and FIG. 6B). Further, each diffraction grating has a single period of 220 nm. The diffraction gratings 23a and 23b being constituted as such, they can select a laser beam that has a plurality of oscillation longitudinal modes having a center wavelength of 1480 nm.

As shown in FIG. 6A, the stripe 18a has a p-side electrode 8a disposed over the whole surface of a p-InGaAsP contact layer 7. As shown in FIG. 6B, the stripe 18b has a p-side electrode 8b disposed on a portion on the p-InGaAsP contact layer 7, thereby forming a non-current-injection area 14 on the area on which the p-side electrode 8b is not disposed. A low reflection film is made to have a light reflectivity of not more than 1%, preferably not more than 0.01% so that the effect of reflection of Fabry Perot modes at the emission end surface is suppressed.

Characteristics of the second embodiment based on the provision of the diffraction gratings 23a and 23b will be explained below with reference to FIG. 7 and FIG. 8. To simplify the explanation, in the semiconductor laser device according to the second embodiment, the injection current is assumed to flow only to the stripe 18a.

The semiconductor laser device in the second embodiment is assumed to be used as an pump light source for the Raman amplifier, and has an oscillation wavelength λ of 1100 nm to 1550 nm, and a resonator length L from 800 μm to 3200 μm inclusive. In general, a mode spacing Δλ of longitudinal modes generated within the resonator of the semiconductor laser device can be expressed by the following equation, $$\Delta\lambda = \lambda o^2/(2\,n\,L) \quad (1)$$

where "n" is an effective refractive index. If oscillation wavelength λo is assumed to be 1480 nm and the effective refractive index to be 3.5, the mode spacing Δλ of the longitudinal modes is about 0.39 nm for the case of resonator length L being 800 μm, and about 0.1 nm for the case of resonator length L being 3200 μm. In other words, the larger the resonator length, the shorter the mode spacing Δλ of the longitudinal mode may become, and the more difficult it may become for a selection condition to be met that allows the laser beam to oscillate in a single longitudinal mode.

On the other hand, in the second embodiment, the diffraction grating 23a selects a longitudinal mode based on a Bragg wavelength thereof. The selection wavelength characteristic of the diffraction grating 23a is expressed as an oscillation wavelength spectrum 23 shown in FIG. 7.

Figure 7:
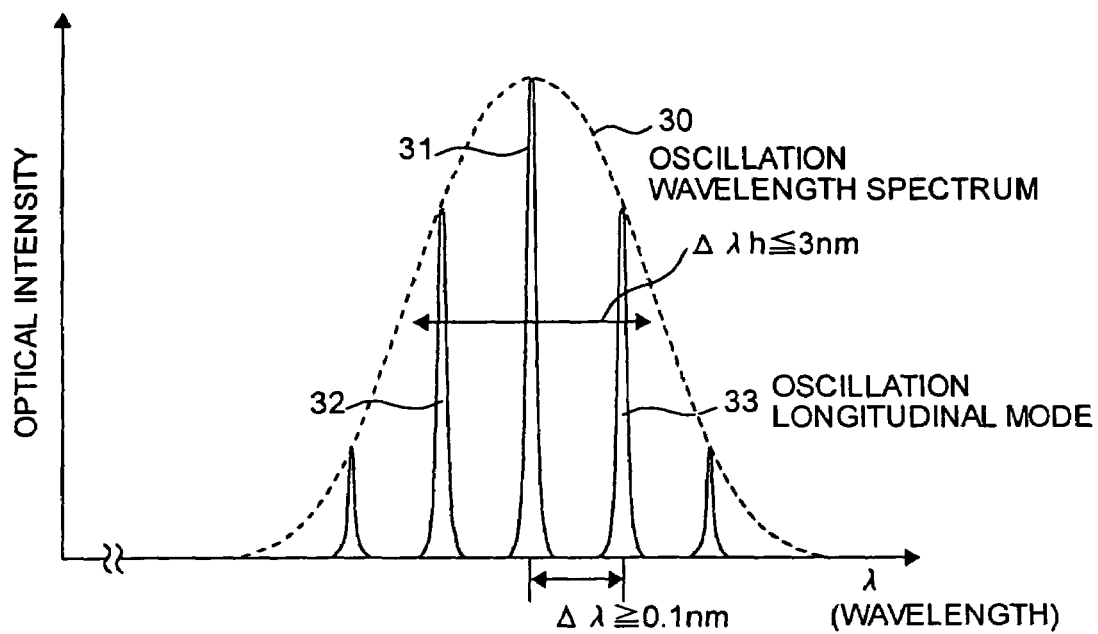
FIG. 7 shows an oscillation wavelength spectrum and oscillation longitudinal modes of one center wavelength in the semiconductor laser device shown in FIG. 5.

As shown in FIG. 7, in the second embodiment, a plurality of oscillation longitudinal modes is made to exist in a wavelength selection characteristic expressed in terms of a half width Δλh of the oscillation wavelength spectrum 30 of the semiconductor laser device having the diffraction grating. The conventional DFB (Distributed-Feedback) semiconductor laser device has been difficult to oscillate in single longitudinal mode if the resonator length L is set to not less than 800 μm. Therefore, a semiconductor laser device having such a resonator length L has not been used. The semiconductor laser device of the second embodiment, however, positively adopts a resonator length not less than 800 μm so that it emits a laser beam including a plurality of oscillation longitudinal modes within the half-width Δλh of the oscillation wavelength spectrum. In FIG. 7, there are three oscillation longitudinal modes 31 to 33 included in the half width Δλh of the oscillation wavelength spectrum.

Figure 8A:
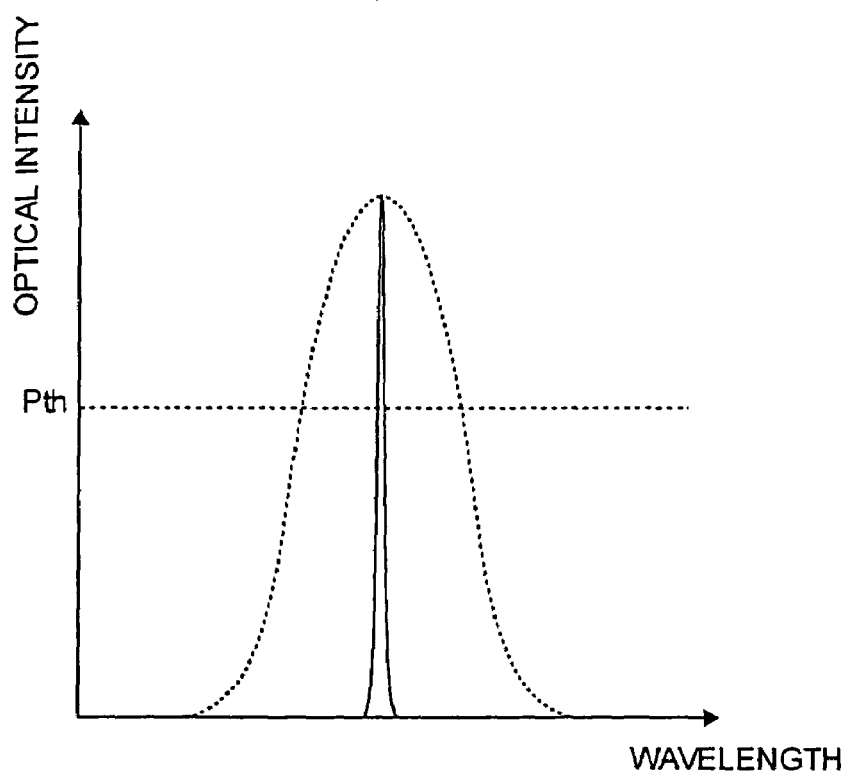
FIG. 8A and FIG. 8B illustrate a relation between optical intensity of the oscillation longitudinal mode and a threshold value of an stimulated Brillouin scattering in the cases of single longitudinal mode oscillation and multi-longitudinal mode oscillation, respectively.

The use of such laser beam having a plurality of oscillation longitudinal modes makes it possible to obtain a high laser output overall, with the intensity of individual oscillation longitudinal mode being suppressed as compared with the case of a laser beam oscillating in single longitudinal mode. For instance, the semiconductor laser device according to the second embodiment has an oscillation spectrum shown in FIG. 8B, where a high laser output is achieved overall with reduced intensity of individual longitudinal mode. On the other hand, FIG. 8A shows an oscillation spectrum of a semiconductor laser device that oscillates in a single longitudinal mode to obtain the same laser output, where the longitudinal mode has a larger intensity.

Figure 8B:
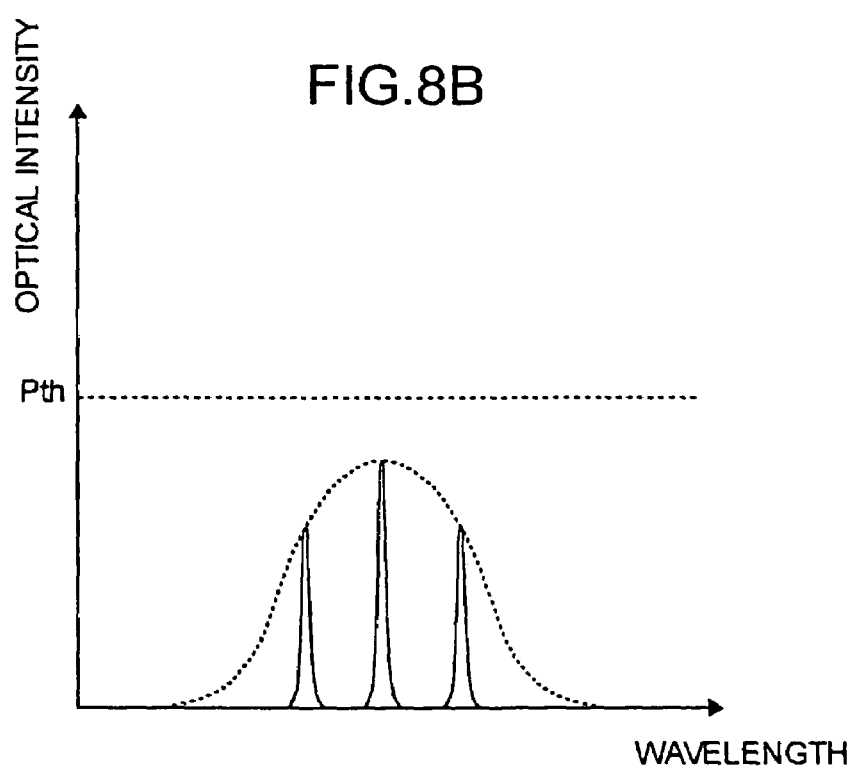

That is, when the semiconductor laser device is used as a pump light source for the Raman amplifier, it is preferable to increase a pumping optical output power in order to increase a Raman gain. However, if the oscillation longitudinal mode is intense, noise is generated to a greater extent through stimulated Brillouin scattering. Since the stimulated Brillouin scattering occurs when the oscillation longitudinal mode intensity exceeds the threshold Pth, Brillouin scattering can be suppressed by including a plurality of oscillation longitudinal modes within the laser beam, while keeping overall laser output, and thereby suppressing the intensity of each oscillation longitudinal mode below the threshold Pth of stimulated Brillouin scattering, as shown in FIG. 8B. In this way, a high Raman gain can be obtained.

From the above viewpoint, it is preferable that a plurality of oscillation longitudinal modes is included in the half-width Δλh of the oscillation wavelength spectrum 30.

When the oscillation wavelength spectral width is excessively large, the coupling loss in the wavelength combining coupler increases. In addition, the movement of the wavelength within the oscillation spectral width could be a cause of fluctuation in noise and gain. For this reason, the half-width Δλh of the oscillation wavelength spectrum 30 should be not more than 3 nm, or more preferably, not more than 2 nm.

The wavelength interval (mode spacing) Δλ between the oscillation longitudinal modes 31 to 33 is 0.1 nm or higher. This is because in case of using the semiconductor laser device as a pumping light source for the Raman amplifier, the stimulated Brillouin scattering is more likely to occur if the mode spacing Δλ is not more than 0.1 nm. As a result, using the above-described equation of the mode spacing Δλ, the resonator length L is preferably not more than 3200 μm.

Further, since the conventional semiconductor laser device has been used in a semiconductor laser module with a fiber grating, the resonance between the fiber grating and the light reflection surface has caused an increase in relative intensity noise (RIN) and hampered a stable Raman amplification. However, since the semiconductor laser device shown in the second embodiment is not equipped with a fiber grating so that a laser beam emitted from the low reflection film 13 is directly used as an pump light source for the Raman amplifier, it is possible to reduce the relative intensity noise, and consequently, fluctuations in Raman gain. Therefore, it is possible to carry out a stable Raman amplification.

In addition to the above-explained many advantages that exists in providing the diffraction grating, the semiconductor laser device according to the second embodiment, has another advantage which arises from combination with the structures of the p-side electrodes 8a and 8b.

In other words, since the semiconductor laser device according to the second embodiment has non-current injection areas 14 like those in the first embodiment, the wavelength of each oscillation longitudinal mode of the laser beam emitted from the stripe 18a and the wavelength of each oscillation longitudinal mode of the laser beam emitted from the stripe 18b are different from each other. Therefore, it is possible to suppress overlapping of the oscillation longitudinal modes, resulting in sufficient reduction of DOP, when such two laser beams are polarization-combined. It is also possible, similarly to the first embodiment, to simplify the manufacturing process of the semiconductor laser device and to make the device compact, as compared with the case where laser beams from two distinct semiconductor laser devices are polarization-combined.

Figure 9:
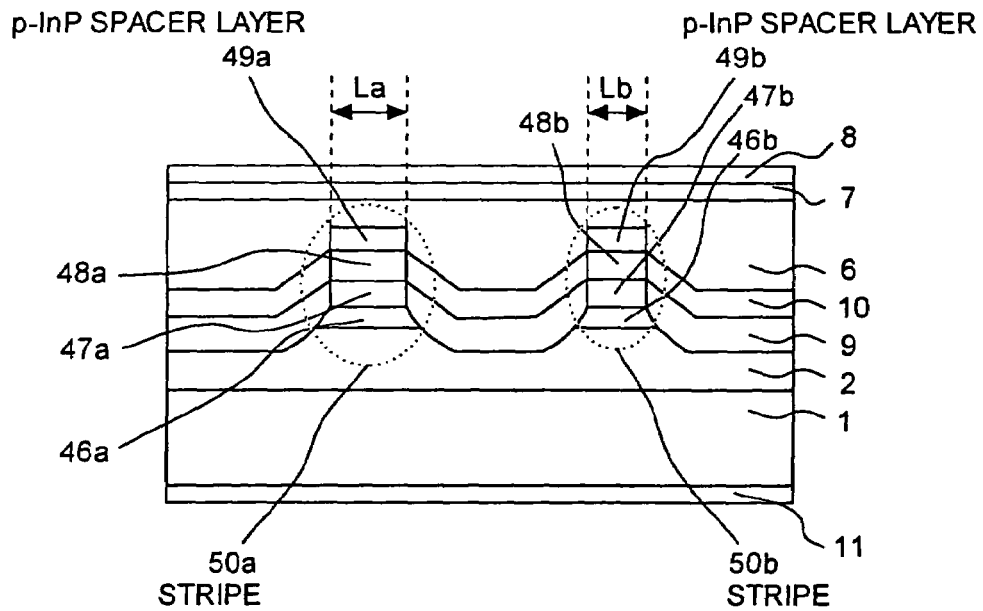
FIG. 9 is a cross-section of a semiconductor laser device according to a third embodiment of the present invention.

Next, a semiconductor laser device according to a third embodiment of the present invention will be described below. The semiconductor laser device according to the third embodiment of the present invention has a plurality of stripe structures on a single semiconductor substrate. An oscillation longitudinal mode wavelength of a laser beam emitted by each stripe is made different by varying the width of each stripe in the lateral direction. This is explained in more detail with reference to FIG. 9.

The semiconductor laser device according to the third embodiment has a stripe 50a and a stripe 50b on a single n-InP substrate 1. The stripe 50a includes a lower GRIN-SCH layer 46a, an active layer 47a, an upper GRIN-SCH layer 48a, and a p-InP spacer layer 49a deposited sequentially. The stripe 50b includes a lower GRIN-SCH layer 46b, an active layer 47b, an upper GRIN-SCH layer 48b, and a p-InP spacer layer 49b deposited sequentially. The width La of the stripe 50a in lateral direction is greater than the width Lb of the stripe 50b in lateral direction. The p-InP spacer layer 49a and 49b each includes, similar to the second embodiment, a diffraction grating that selects a laser beam having a specific center wavelength and a plurality of oscillation longitudinal modes. Parts that are identical or similar to those in the first embodiment or second embodiment are assigned identical or similar reference numerals or symbols and have identical or similar functions.

In the semiconductor laser device according to the third embodiment, the laser beam emitted by each stripe is caused to have a different oscillation longitudinal mode wavelength by varying the width of each stripe in lateral direction. Below is explained the reason for the difference in the oscillation longitudinal mode wavelength of the laser beam emitted by each stripe.

In general, in a semiconductor laser device, heat produced in the active layer due to a light non-emission recombination current etc. acts to raise the temperature around the active layer, giving an adverse effect on the characteristic of the emitted laser beam. To keep the temperature of the active layer from rising excessively, the semiconductor laser device is fixed junction down on a heat sink, making the heat sink to come in contact with the upper electrode, thereby dissipating the heat produced.

For the same reason, the semiconductor laser device according to the third embodiment is fixed junction down as well, with a p-side electrode 8 being in contact with the heat sink. Consequently, the heat produced in the active layer 47a during laser oscillation is released into the heat sink through the upper GRIN-SCH layer 48a, the p-InP spacer layer 49a, and a p-InP clad layer 6. Similarly, the heat produced in the active layer 47b is released into the heat sink through the upper GRIN-SCH layer 48b, the p-InP spacer layer 49b and the p-InP clad layer 6. In this way, the heat produced in the active layers 47a and 47b are released to the outside through the stripes 50a, and 50b, respectively and the area above the stripes 50a and 50b, all of which collectively function as a thermal conduction channel.

The thermal conduction efficiency, in general, proportionally increases with the cross-sectional area of the thermal conduction channel. In the third embodiment, the cross-sectional area of the stripes 50a and 50b differ because of the difference in their widths La and Lb. Therefore, the respective thermal conduction efficiencies of the stripe 50a and the stripe 50b are different. Consequently, during laser oscillation, the temperature in the vicinity of the active layer 47a and the temperature in the vicinity of the active layer 47b are different.

It is well known that the refractive index of the semiconductor single-crystals, that constitute the stripes 50a and 50b, depends on the temperature. And since the wavelength of each oscillation longitudinal mode and the oscillation longitudinal mode spacing are dependent on the optical path length determined by taking into account the refractive index, they are different between the laser beam emitted from the stripe 50a and the laser beam emitted from the stripe 50b. When such two laser beams are polarization-combined, the overlapping of the two oscillation longitudinal modes is suppressed. Therefore, the DOP of the combined beam can be sufficiently reduced.

Another advantage is that in the third embodiment an electrical resistance to the injected current also varies due to the difference in the lateral width. That is, since the electrical resistance is inversely proportional to the cross-sectional area, the stripes 50a and 50b, which have different widths, have different value of electrical resistance from each other. Therefore, the electric current flowing into the active layer 47a and the electric current flowing into the active layer 47b are different, which causes not only the wavelength of each oscillation longitudinal mode to be different between the two stripes based on the similar reason to the first embodiment, but also the amount of heat produced in the active layers 47a and 47b to be different from each other, leading to different temperatures of the active layers 47a and 47b and different wavelengths of oscillation longitudinal modes between the two stripes.

While each stripe has a diffraction grating for wavelength selection in the third embodiment, it is also possible to use Fabry-Perot resonators for wavelength selection, as in the first embodiment.

Further, in the third embodiment, the semiconductor laser device is fixed p-side down on the heat sink. However, the semiconductor laser device may be fixed on the heat sink so that an n-side electrode 11 comes in contact with the heat sink. In this case too, the heat produced in the active layers 47a and 47b is released to the heat sink through stripes 50a and 50b, respectively, and the area below the stripes 50a and 50b, which collectively act as a thermal conduction channel. Therefore, by having different widths La and Lb, the thermal conduction efficiencies can be different between the stripes 50a and 50b. As a result, the oscillation longitudinal mode wavelengths of the laser beams emitted by the stripes 50a and 50b are different from each other. Consequently, the DOP can be reduced.

Figure 10:
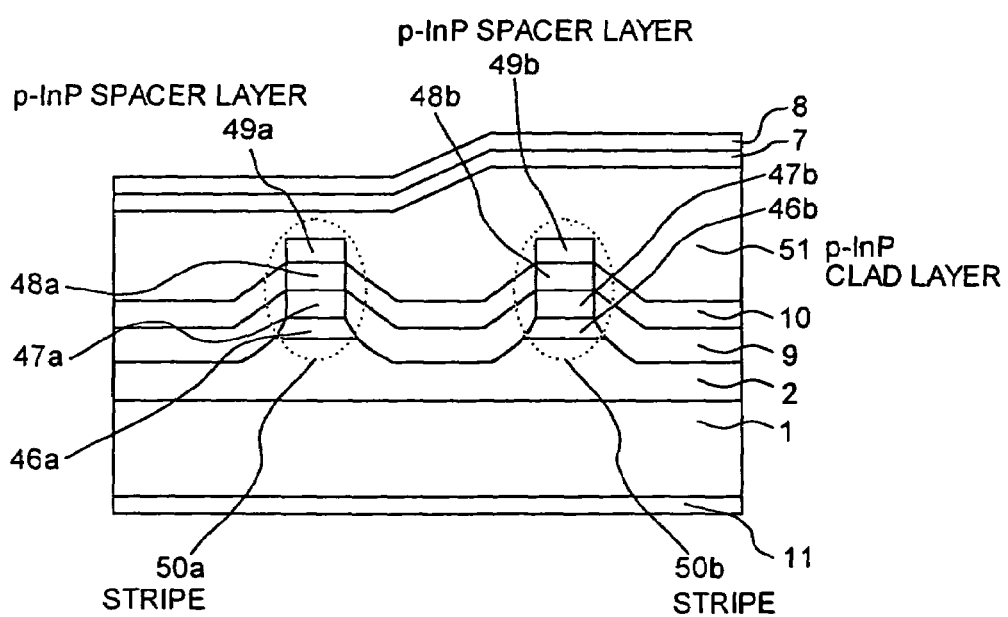
FIG. 10 is a cross-section of a semiconductor laser device according to a modification of the third embodiment.

Next, a modification of the semiconductor laser device according to the third embodiment will be described below. FIG. 10 is a cross-section showing a structure of the modification of the semiconductor laser device. As shown in FIG. 10, in semiconductor laser device according to the modification, the thermal conduction efficiency is made to differ by varying a thickness of a p-InP clad layer 51.

In the third embodiment, the thermal conduction efficiency is made to differ by varying the cross-sectional areas of the thermal conduction channels. However, the thermal conduction efficiency can be made to differ also by varying the lengths of the thermal conduction channels, in case of equal cross sectional areas. By varying the thickness of the p-InP clad layer 51 disposed above each stripe, the temperature around the active layers 47a and 47b during laser oscillation can be made to differ, and consequently, the oscillation longitudinal mode wavelengths can be different, resulting in reduction of DOP.

In the modification, the variation in the length of the thermal conduction channel can be achieved not only by varying the thickness of the p-InP clad layer 51 but also by varying those of the p-InP spacer layers 49a and 49b. Alternatively, it is possible to cause the oscillation longitudinal mode wavelengths to be different, to thereby reduce the DOP, as long as the structure is such that the distances from the active layers 47a and 47b to the heat sink are different in the two stripes.

Next, a semiconductor laser device according to a fourth embodiment of the present invention will be described below. In the semiconductor laser device according to the fourth embodiment, in each stripe is formed a diffraction grating that selects a plurality of oscillation longitudinal modes and the structure of diffraction gratings is different from one another so that each diffraction grating selects a different center wavelength. The fourth embodiment is explained below with reference to FIG. 11.

Figure 11A:
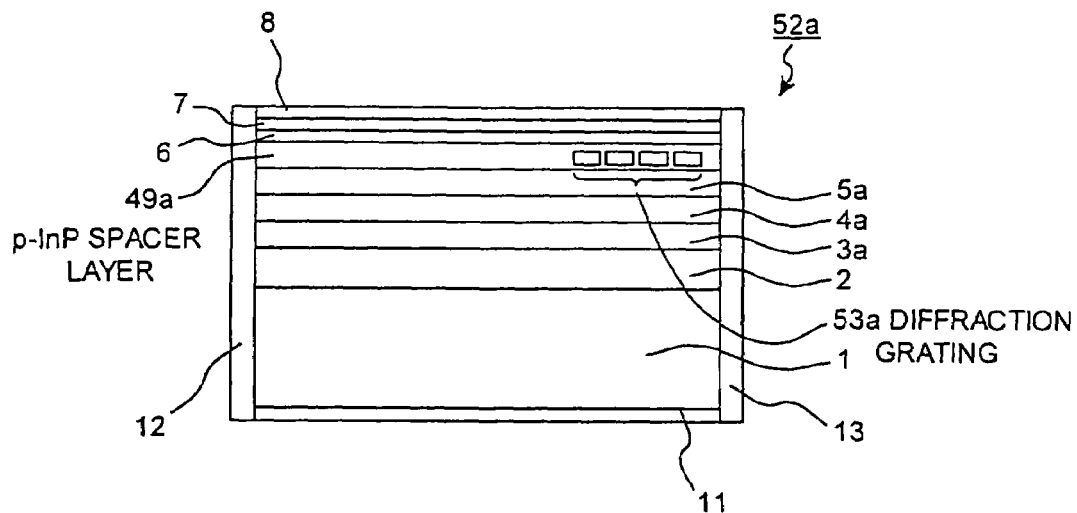
FIG. 11A and FIG. 11B are side cross-sections of a semiconductor laser device according to a fourth embodiment of the present invention.
Figure 11B:
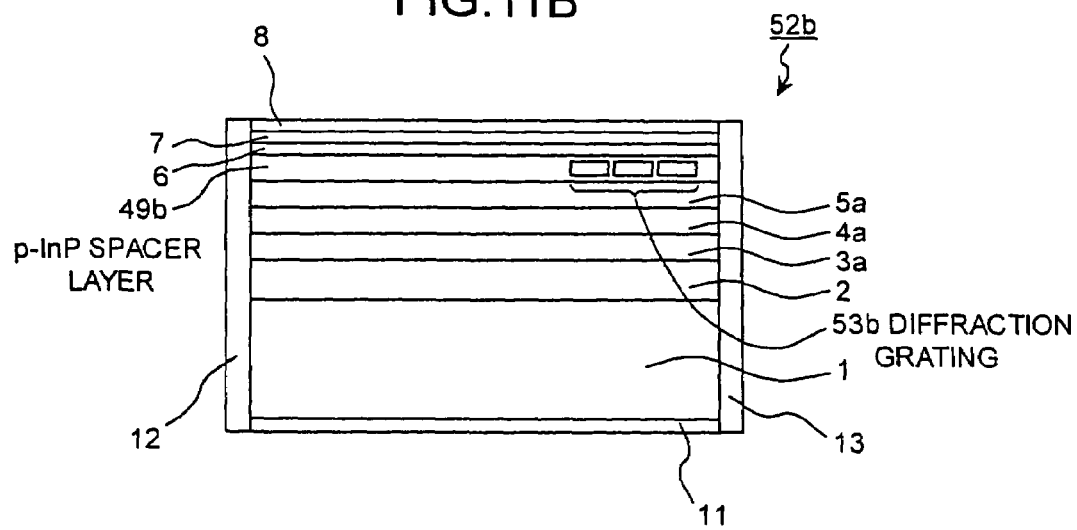

FIG. 11A and FIG. 11B are a side cross-sections that show the structure of the semiconductor laser device according to the fourth embodiment (the front cross-section is the same as FIG. 5 and hence is omitted). FIG. 11A illustrates a stripe 52a that includes a diffraction grating 53a. FIG. 11B illustrates a stripe 52b that includes a diffraction grating 53b. The diffraction gratings 53a and 53b have different periods so that the center wavelength selected by the diffraction grating 53a is different from the center wavelength selected by the diffraction grating 53b. In the present embodiment, based on the above structure, it is possible to reduce the DOP of a polarization-combined laser beam, the reason for which is explained below.

First, the inventors of the present invention measured the relation between a wavelength difference $\Delta\lambda p$, which is a difference of a peak wavelength (a wavelength of the oscillation longitudinal mode of maximum intensity amongst plural oscillation longitudinal modes that constitute an oscillation wavelength spectrum) of a laser beam emitted from each stripe, and the DOP.

To be more specific, orthogonally polarization-combined laser beams, each beam emitted by each one of two semiconductor laser devices having a single stripe, were measured for DOP with changing wavelength difference $\Delta\lambda p$. The two semiconductor laser devices used for the purpose of measurement each had a diffraction grating in the vicinity of its active layer and emitted a laser beam having a plurality of oscillation longitudinal modes arranged with a spacing of 0.2 nm therebetween.

The reason why a semiconductor laser device with a W stripe structure was not used for measurement was because the peak wavelength of each laser beam needed to be easily varied. Instead, to be more specific, each of the semiconductor laser device bearing a single stripe structure was mounted on a separate temperature-adjusting module so as to vary the temperature of the active layer and thereby to vary the peak wavelength. The tendency of DOP of the combined light versus changing wavelength difference $\Delta\lambda p$, represented by the result of measurement obtained for two separate semiconductor laser devices bearing a single stripe structure, applies equally to a semiconductor laser device bearing a W stripe structure whose peak wavelengths of the laser beams emitted from the two stripes are different from each other.

Figure 12:
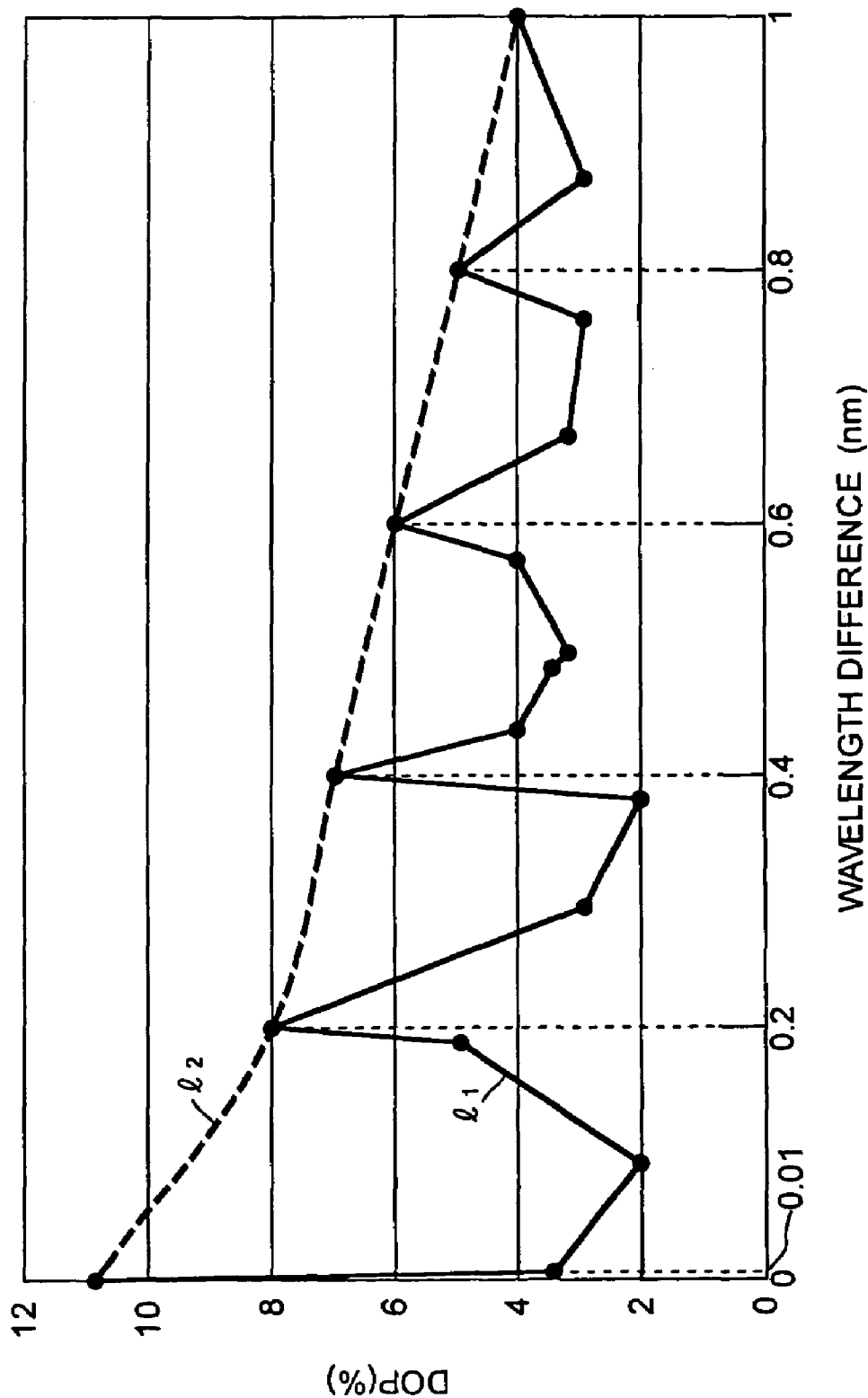
FIG. 12 is a graph showing the correlation between a center wavelength difference and a degree of polarization.

FIG. 12 is a graph showing the result of the measurement. In the graph shown in FIG. 12, the horizontal axis indicates the wavelength difference $\Delta\lambda p$ and the vertical axis indicates DOP. The curve $I_1$ shows a variation of the DOP over a short cycle, while the curve $I_2$ shows a variation of the DOP over a long cycle. As shown by the curve $I_1$, the DOP fluctuates cyclically for every 0.2 nm of the wavelength difference $\Delta\lambda p$. In addition, the DOP tends to decrease as the wavelength difference $\Delta\lambda p$ increases over the long cycle, as shown by curve $I_2$.

From the curve $I_2$ it can be seen that if the wavelength difference $\Delta\lambda p$ is not less than 0.1 nm, the DOP can be suppressed to 10% or lower, and if the wavelength difference $\Delta\lambda p$ is not less than 0.8 nm, the DOP can be suppressed to 5% or lower. Thus, the DOP can be reduced by increasing the wavelength difference $\Delta\lambda p$. When the semiconductor laser device is used as a pump light source of Raman amplifiers, a stable gain can be obtained irrespective of the polarization direction of the signal light.

Meanwhile, from the curve $I_1$ it is evident that though the DOP decreases when the wavelength difference $\Delta\lambda p$ is 0.01 nm or more, it hits a maximum value for every 0.2 nm change of the wavelength difference $\Delta\lambda p$.

Figure 14:
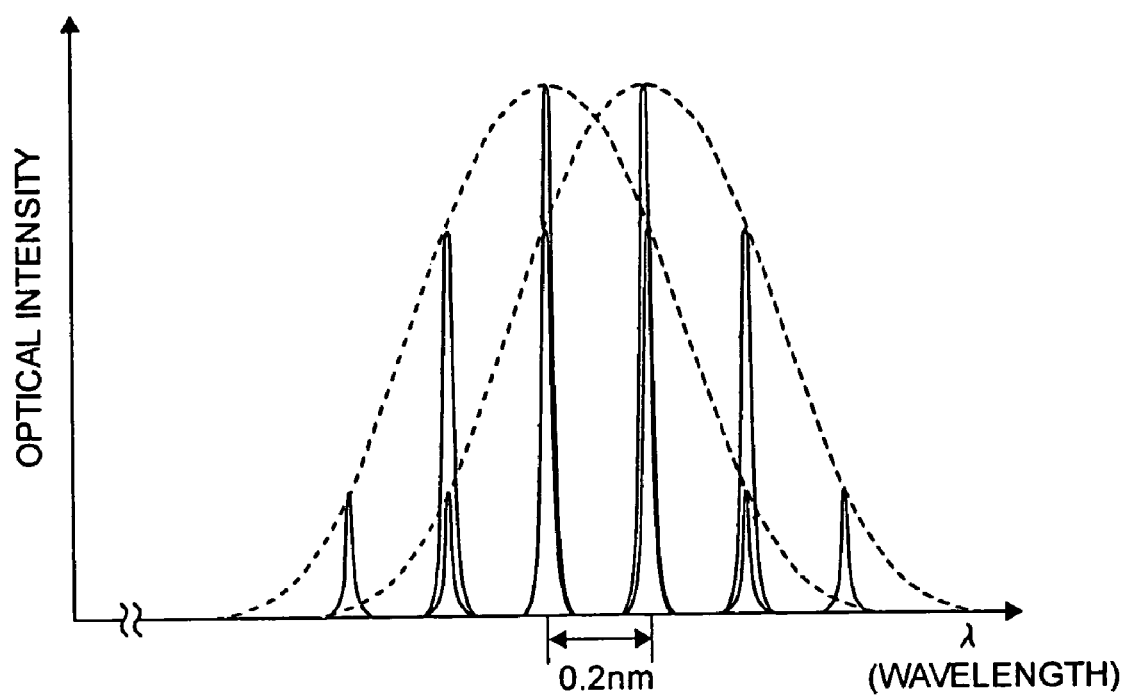
FIG. 14 illustrates a status of overlapping of oscillation longitudinal modes for a case of a wavelength difference of 0.2 nm.

The reason for the cyclical behavior of DOP is as follows. The two semiconductor laser devices used in the present measurement emit laser beams each having a plurality of oscillation longitudinal modes with the longitudinal mode spacing ($\Delta\lambda$: Expression 1) of 0.2 nm, based on their respective diffraction gratings. If the wavelength difference $\Delta\lambda p$ of such two laser beams is 0.2 nm, then the relation between the two laser beams are shown in FIG. 14, where the oscillation longitudinal modes of the two laser beams overlap, even though the peak wavelengths of their oscillation spectrums are different from each other. In such a situation, the DOP does not reduce sufficiently. However, as the wavelength difference $\Delta\lambda p$ increases, the intensity difference of the overlapping oscillation longitudinal modes increases and the number of oscillation longitudinal modes decreases. Therefore, the DOP tends to decrease over a long cycle.

Figure 15:
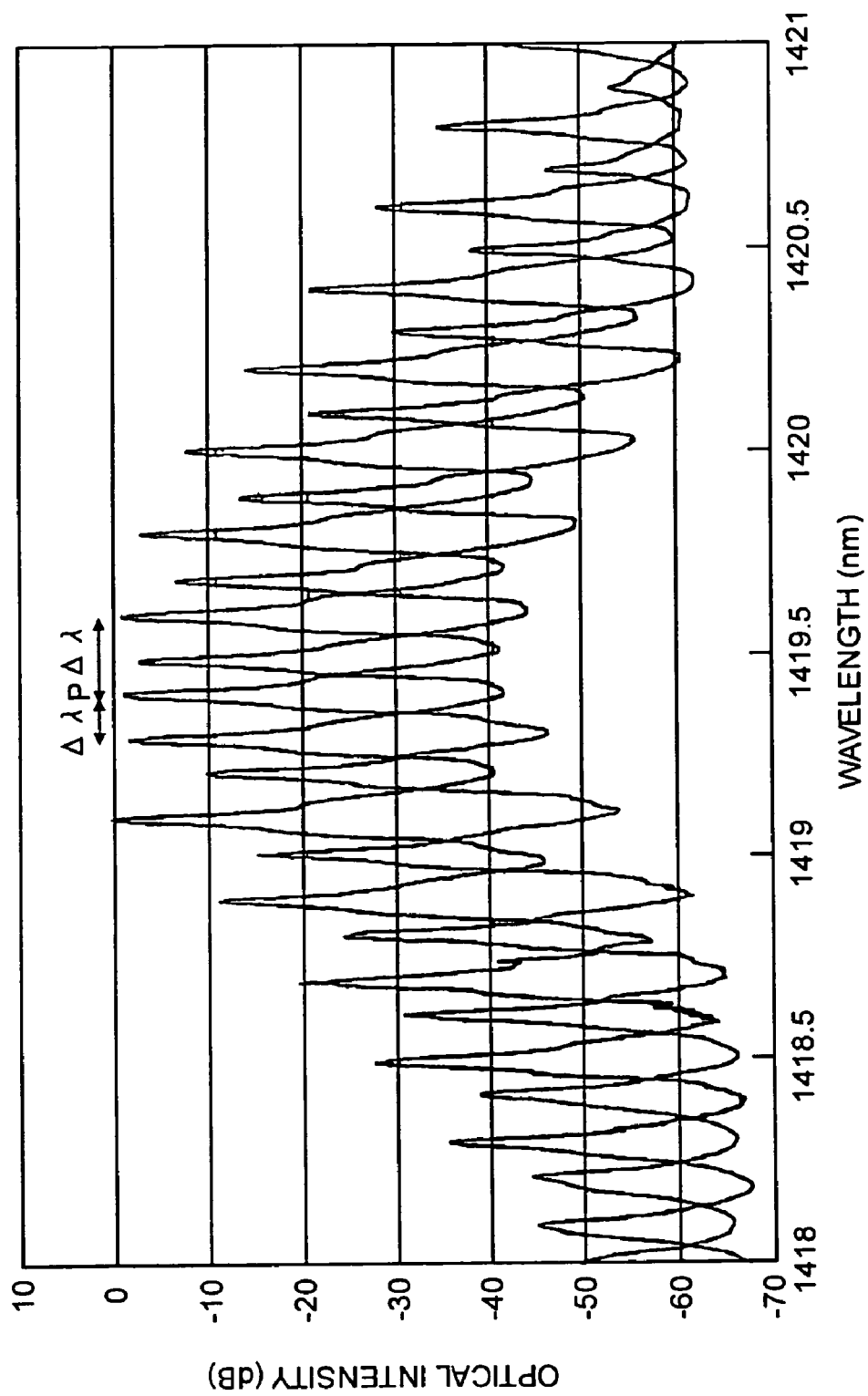
FIG. 15 is oscillation spectrum waveforms of two laser beams in a condition where a wavelength difference is set in such a way that an oscillation longitudinal mode of one laser beam is interleaved between two adjacent oscillation longitudinal modes of the other laser beam.

Thus, in the structure according to first to third embodiments, the wavelengths of the oscillation longitudinal modes of the two laser beams are slightly shifted with respect to each other (by 0.01 nm to 0.2 nm), whereby the DOP can be suppressed. In other words, the oscillation longitudinal modes of the two laser beams appear as shown in FIG. 15, where the oscillation longitudinal mode of one laser beam is interspersed between two adjacent oscillation longitudinal modes of the other laser beam. Thus, there is no overlapping of the two oscillation longitudinal modes. Consequently, it is possible to reduce DOP of the orthogonally polarization-combined laser beam.

However, in the fourth embodiment, the center wavelength selected by the diffraction gratings 53a and 53b are made as different as possible whereby the DOP of the combined light is reduced irrespective of whether the oscillation longitudinal modes of the two stripes overlap or not, unlike in the first to third embodiments in which the DOP of the combined light is reduced by preventing the overlapping of the oscillation longitudinal modes, which is attained through changing the electrode structure or layer structure of the semiconductor laser device.

Figure 13A:
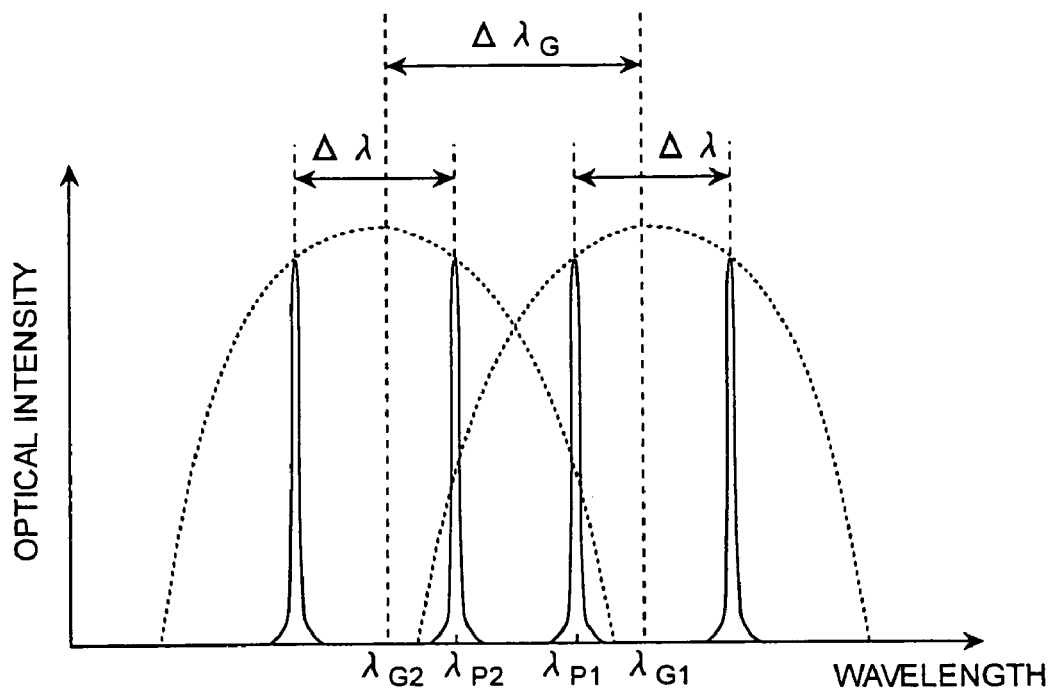
FIG. 13A and FIG. 13B illustrate a relation between a center wavelength of a diffraction grating and a wavelength of an oscillation longitudinal mode of peak intensity of each laser beam in the semiconductor laser device according to the fourth embodiment.

The conditions that the diffraction gratings 53a and 53b must meet in order to select different center wavelengths will be examined with reference to FIG. 13A. FIG. 13A illustrates an instance in which the oscillation longitudinal mode of maximum intensity (with peak wavelength $\lambda_{p1}$) of the first laser beam is on the short wavelength side with respect to the center wavelength $\lambda_{G1}$ of the diffraction grating. 53a formed in the first stripe structure 52a, and the oscillation longitudinal mode of maximum intensity (with peak wavelength $\lambda_{p2}$) of the second laser beam is on the long wavelength side with respect to the center wavelength $\lambda_{G2}$ of the diffraction grating 53b formed in the second stripe structure 52b.

According to the curve $I_2$ in FIG. 12, a DOP can be reduced at least to 10% or less if the wavelength difference $\Delta\lambda p$ ($=\lambda_{p1}-\lambda_{p2}$) is not less than half of the oscillation longitudinal mode spacing $\Delta\lambda$ ($=0.2$ nm) (that is, not less than 0.1 nm). Referring to FIG. 13A, the difference $\Delta\lambda_G$ ($=\lambda_{G1}-\lambda_{G2}$) between the center wavelengths of the diffraction gratings required for the DOP of the combined light to be 10% or lower irrespective of whether the oscillation longitudinal modes of the laser beams emitted from the two stripes overlap or not, can be calculated as given below:

$$\Delta\lambda_G \geq \Delta\lambda/2 + \Delta\lambda/2 + \Delta\lambda/2 = 1.5\Delta\lambda \quad (2)$$

Similarly, according to the curve $I_2$ in FIG. 12, a DOP can be reduced at least to 5% or less if the wavelength difference $\Delta\lambda p$ is not less than four times the oscillation longitudinal mode spacing $\Delta\lambda$ (that is, not less than 0.8 nm). Referring to FIG. 13A, the difference $\Delta\lambda_G$ between the center wavelengths of the diffraction gratings required for the DOP of the combined light to be 5% or lower irrespective of whether the oscillation longitudinal modes of the laser beams emitted from the two stripes overlap or not, can be calculated as given below:

$$\Delta\lambda_G \geq \Delta\lambda/2 + \Delta\lambda/2 + 4\Delta\lambda = 5\Delta\lambda \quad (3)$$

Thus, if the diffraction gratings are designed such that the difference $\Delta\lambda_G$ between the center wavelengths selected by the diffraction gratings formed in the two stripes is 1.5 times, preferably 5 times the oscillation longitudinal mode spacing $\Delta\lambda$ of the laser beams, the DOP can be reduced to either 10% or 5% respectively, irrespective of whether the oscillation longitudinal modes overlap or not.

Further, referring to FIG. 13A, the difference $\Delta\lambda_G$ between the center wavelengths can be reduced when the peak wavelength is more or less equal to the center wavelength, that is, when $\lambda_{p1} \approx \lambda_{G1}$ and $\lambda_{p2} \approx \lambda_{G2}$. In this case, the wavelength difference $\Delta\lambda p$ is not less than half of the oscillation longitudinal mode spacing $\Delta\lambda$ when $$\Delta\lambda_G \approx \Delta\lambda p \geq \Delta\lambda/2 \quad (4)$$

Figure 13B:
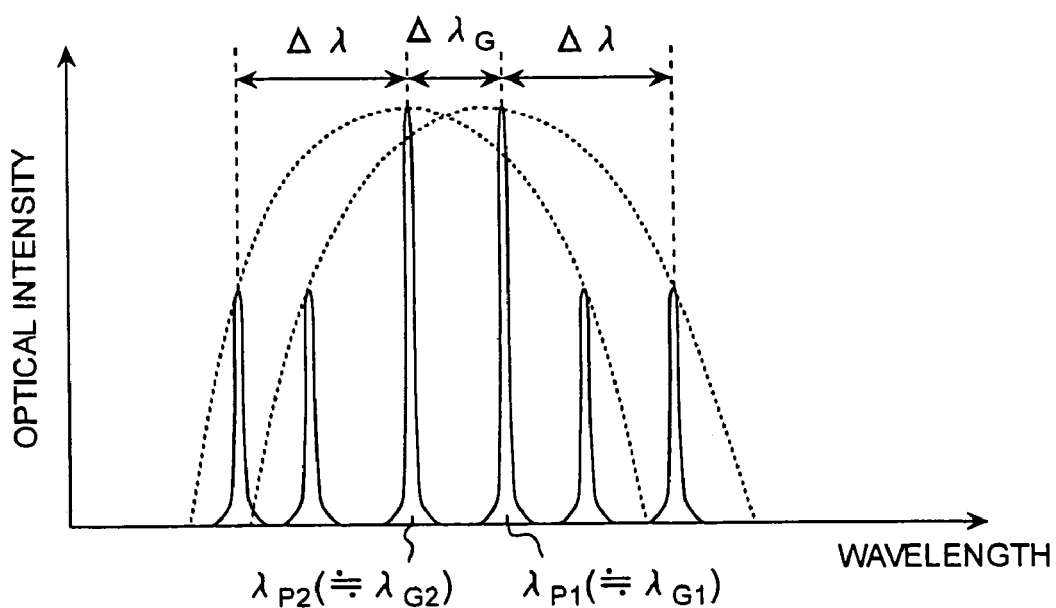

If $\Delta\lambda_G = \Delta\lambda p$, then $\Delta\lambda_G \geq \Delta\lambda/2$, then according to the curve $I_2$ in FIG. 12, the DOP reduces to 10% or lower. Even if $\Delta\lambda_G$ and $\Delta\lambda p$ are only more or less the same and do not match exactly, the DOP can be reduced to about 10%. In FIG. 13A and FIG. 13B, if the two stripes emit laser beams with different oscillation longitudinal modes, the DOP of the combined light can be reduced by applying any one of oscillation longitudinal mode spacing $\Delta\lambda$ in expressions (2) through (4).

Figure 16:
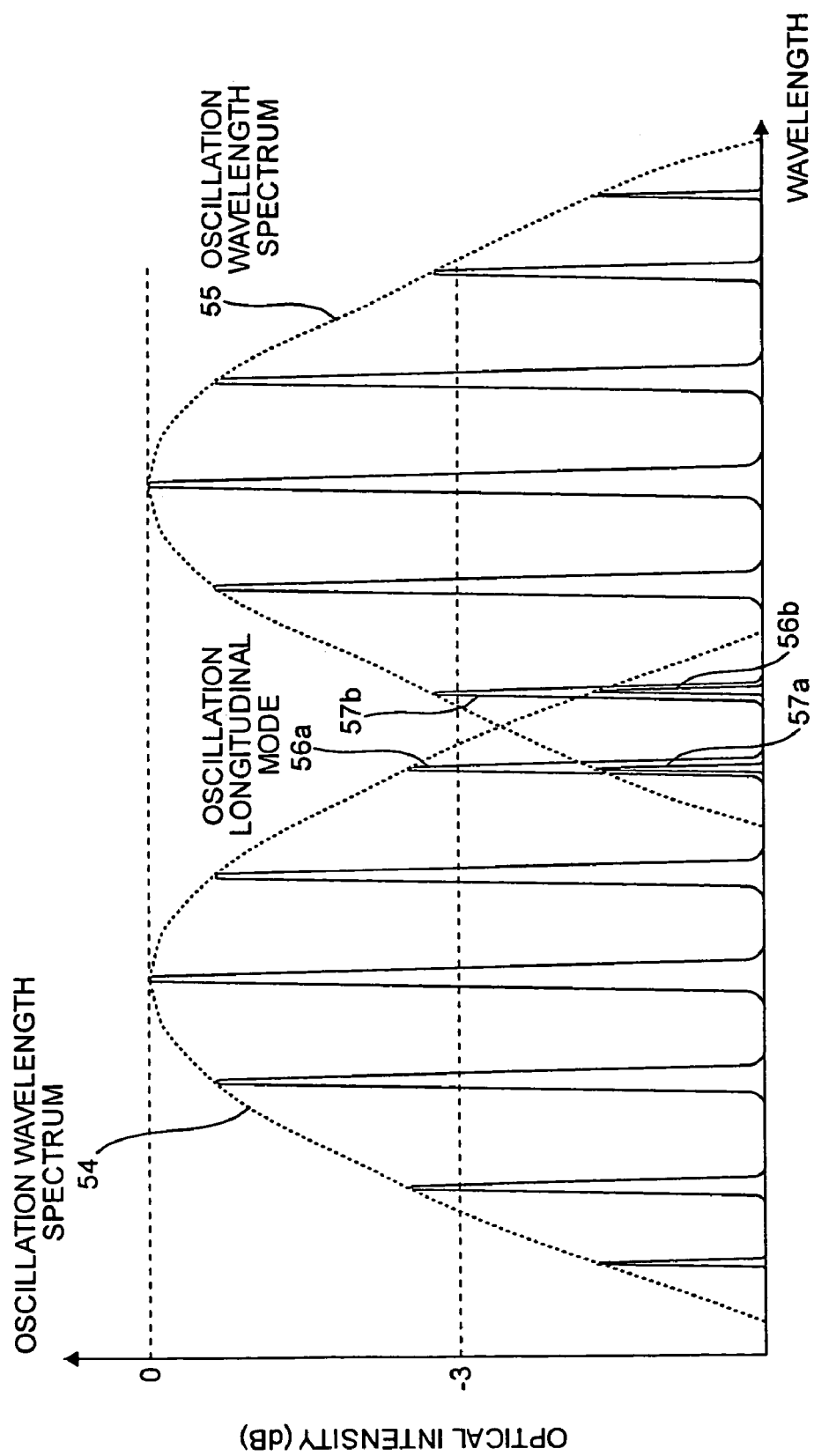
FIG. 16 illustrates a status of two oscillation wavelength spectrums not intersecting each other above a specific intensity.

Another method for determining the center wavelength of the diffraction grating of each stripe so that the DOP of the combined light can be reduced is to evade overlapping of the oscillation wavelength spectrums 54 and 55 of two laser beams on their portion above a specific power, as shown in FIG. 16. To be more specific, the center wavelength difference of the diffraction gratings $\Delta\lambda_G$ should be set such that the portion of the oscillation wavelength spectrums 54 and 55 having an intensity difference not more than 3 dB with respect to the maximum intensities of the laser beams do not cross each other. In the schematic diagram shown in FIG. 16, even though the oscillation longitudinal mode 56a belonging to the oscillation wavelength spectrum 54 and the oscillation longitudinal mode 57a belonging to the oscillation wavelength spectrum 55 are overlapping, the overlapping is negligible enough to keep DOP from increasing to a large extent, since the difference between the intensity of the oscillation longitudinal mode 57a and the maximum intensity of the laser beam is more than 3 dB. For similar reasons, even though the oscillation longitudinal mode 57b belonging to the oscillation wavelength spectrum 55 and the oscillation longitudinal mode 56b belonging to the oscillation wavelength spectrum 54 are overlapping. The overlapping has negligible influence on DOP. In order to reduce the DOP further, it is preferable to set the center wavelength difference $\Delta\lambda_G$ such that the oscillation wavelength spectrums 54 and 55 do not cross in the range in which the intensity difference with respect to the maximum intensity of the laser beams is not more than 10 dB.

In this way, it is possible to realize a semiconductor laser device in which the DOP of the polarization-combined laser beam can be effectively reduced, by setting the wavelength difference $\Delta\lambda_G$ to be 1.5 times, preferably 5 times, the oscillation longitudinal mode spacing $\Delta\lambda$, or by setting the wavelength difference $\Delta\lambda_G$ such that the oscillation wavelength spectrums do not cross in the range in which the intensity ratio to the maximum is not more than a predetermined value, specifically 3 dB, or preferably 10 dB.

Figure 17A:
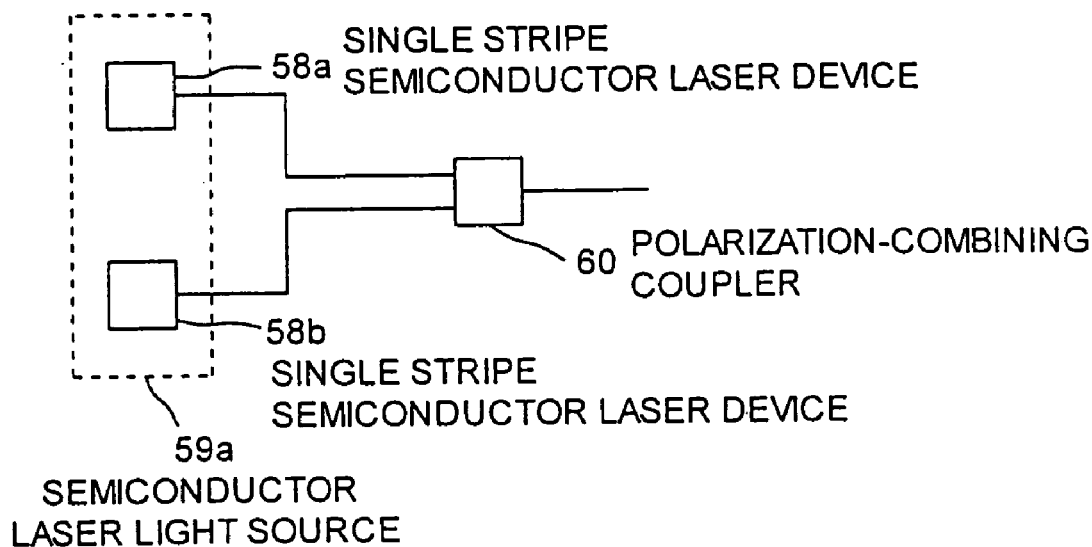
FIG. 17A and FIG. 17B are schematic diagrams of a semiconductor laser beam source.

This method of setting the wavelength difference $\Delta\lambda p$ is not limited to the semiconductor laser beam source formed from a semiconductor laser device having a W stripe structure, but is applicable to the semiconductor laser beam source formed from two separate semiconductor laser devices which has a stripe each on two different substrates. In the latter case as well, the DOP of the polarization-combined beams can be effectively reduced by setting the wavelength difference $\Delta\lambda p$ as described above. To be more specific, the structures shown in FIG. 17A and FIG. 17B can be used. As shown in FIG. 17(a), an pump light source with reduced DOP can be fabricated by a semiconductor laser beam source 59a that includes two semiconductor laser devices 58a and 58b each having a single stripe, which have a wavelength difference of Δλp in the range described above. The laser beams emitted from the two semiconductor laser devices 58a and 58b are orthogonally polarization-combined by a polarization-combining coupler 60.

Figure 17B:
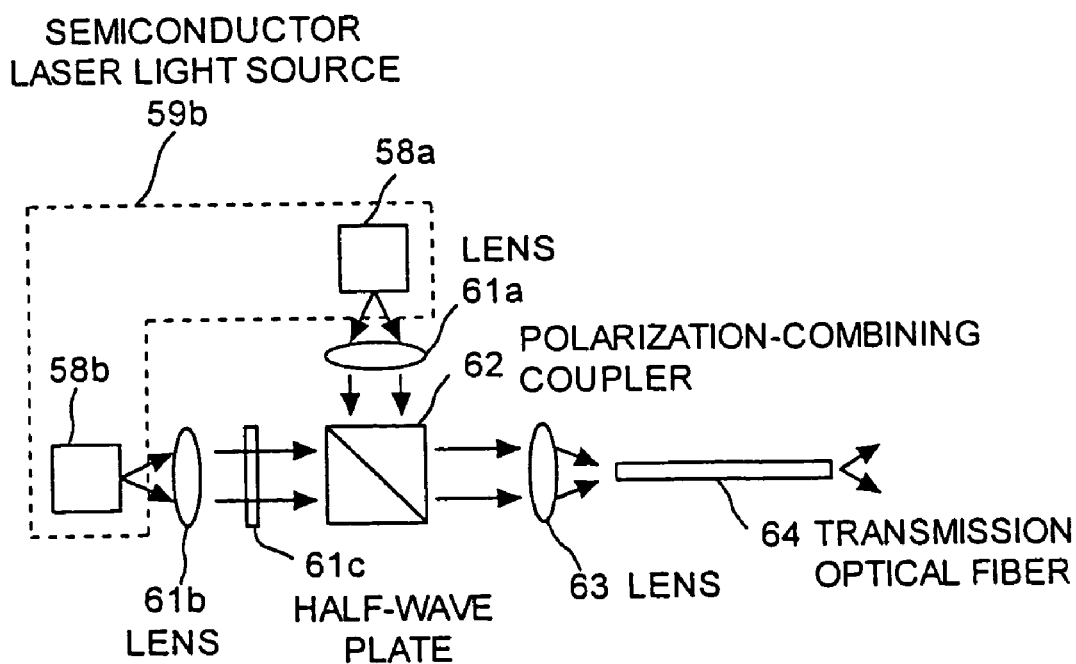

Alternatively, as shown in FIG. 17B, laser beams emitted from two single stripe semiconductor laser devices 58a and 58b that form the semiconductor laser beam source 59b can be directed into the polarization-combining coupler (cube beam splitter) 62 in such a way that the two laser beams are orthogonal to each other. The laser beam which is emitted from the single stripe semiconductor laser device 58a and collimated by a lens 61a and the laser beam which is emitted from the single stripe semiconductor laser device 58b, collimated by a lens 61b, and passed through a half-wave plate 61c, are orthogonally polarization-combined by the polarization-combining coupler 62. Thus, a light with reduced DOP is input into a transmission optical fiber 64. In the semiconductor laser beam source shown in FIG. 17A and FIG. 17B, the two laser beams can be made to have a wavelength difference described above by appropriately adjusting the temperature of each semiconductor laser device.

In the semiconductor laser device having a W stripe structure and in the beam source having the single stripe semiconductor laser devices shown in FIG. 17A and FIG. 17B, the DOP of the combined light can be reduced by setting the wavelength of the two laser beam between the cyclical peak of the DOP shown in FIG. 12 through a fine-tuning of the wavelength of each laser beam. For instance, according to the trend of the curve $I_1$ of FIG. 12, the DOP of the combined light can be lowered by making the wavelength difference of the oscillation longitudinal modes of the laser beams emitted from the two semiconductor light sources not less than 0.01 nm, preferably not less than 0.1 nm. Here, the above wavelength difference may be made on all the oscillation longitudinal modes. However, it may be made only on the oscillation longitudinal modes of a specific intensity or higher. This is because the oscillation longitudinal modes of higher intensity contribute more to reducing DOP of the combined light. To be more specific, the DOP of the combined light can be reduced by making the above-described wavelength difference on the oscillation longitudinal modes of intensity ratio not more than 3 dB, preferably not more than 10 dB, to the peak intensity.

In addition, in order to avoid overlapping of the oscillation longitudinal mode of one laser beam with that of the other laser beam, the wavelength difference Δλp of the two semiconductor laser beam source may be adjusted as follows:

$$\Delta\lambda p = (\Delta\lambda/2) \times (2n-1) \quad (5)$$

where Δλ is the oscillation longitudinal mode spacing between two adjoining oscillation longitudinal modes and n is a natural number. In the measurement done to obtain FIG. 12, since the oscillation longitudinal mode spacing Δλ of the semiconductor laser beam source is 0.2 nm, the DOP can be reduced if the wavelength difference becomes, 0.1 nm, 0.3 nm, 0.5 nm, etc, according to the equation (5). When this is the case, the oscillation longitudinal modes of one laser beam are interspersed between the oscillation longitudinal modes of the other laser beam, as shown in FIG. 15. Thus, the overlapping of the oscillation longitudinal modes of the two laser beams is prevented. Consequently, the DOP of the orthogonally polarization-combined laser light can be reduced.

Next, the conditions required for suppressing the beat noise will be examined. If the wavelengths of the oscillation longitudinal modes of the laser beams that are polarization-combined are not sufficiently apart from each other, a noise will appear on a frequency corresponding to the frequency difference between the two oscillation longitudinal modes, due to a polarization mixing occurred over a long distance transmitted, even when the wavelength difference Δλp is set as described above.

Even when such beat noise does occur, at least its adverse effect can be avoided if it can be made to occur outside the transmission band of the optical transmission system in which the semiconductor laser device is used. This is because the beat noise that appears outside the transmission band will not be a cause of signal noise that occurs during Raman amplification.

To be more specific, the wavelength difference Δλp should be set in the following manner. As shown in FIG. 18, the center wavelengths $\Delta\lambda_{p1}$ and $\Delta\lambda_{p2}$ should be set such that the frequency difference between the oscillation longitudinal mode 65 belonging to the laser beam emitted from the first stripe of a center wavelength $\lambda_{p1}$, and having maximum wavelength among the plurality of oscillation longitudinal modes of intensity not more than 10 dB below maximum intensity of the emitted laser beam, and the oscillation longitudinal mode 66 belonging to the laser beam emitted from the second stripe of a center wavelength $\lambda_{p2}(>\lambda_{p1})$, and having minimum wavelength among the plurality of oscillation longitudinal modes of intensity not more than 10 dB below maximum intensity of the emitted laser beam, should be greater than the electrical band width of the optical transmission system in which the semiconductor laser device is used. In this way, even if the polarization mixing occurs during long-distance transmission of the laser beam over the optical fiber, the beat noise may occur only in a frequency range outside the transmission band of the transmission system. Consequently, adding of noise on signal light can be prevented.

To be more specific, the diffraction grating of each stripe should be set in such a way that the wavelength difference Δλp is not less than a few nm to a few tens of nm (for example, not less than 3 nm). More preferably, the wavelength difference Δλp may be not less than 20 nm. For instance, the laser beam emitted from one stripe may have a center wavelength of 1430 nm, while the laser beam emitted from the other stripe may have a center wavelength of 1450 nm.

Figure 19:
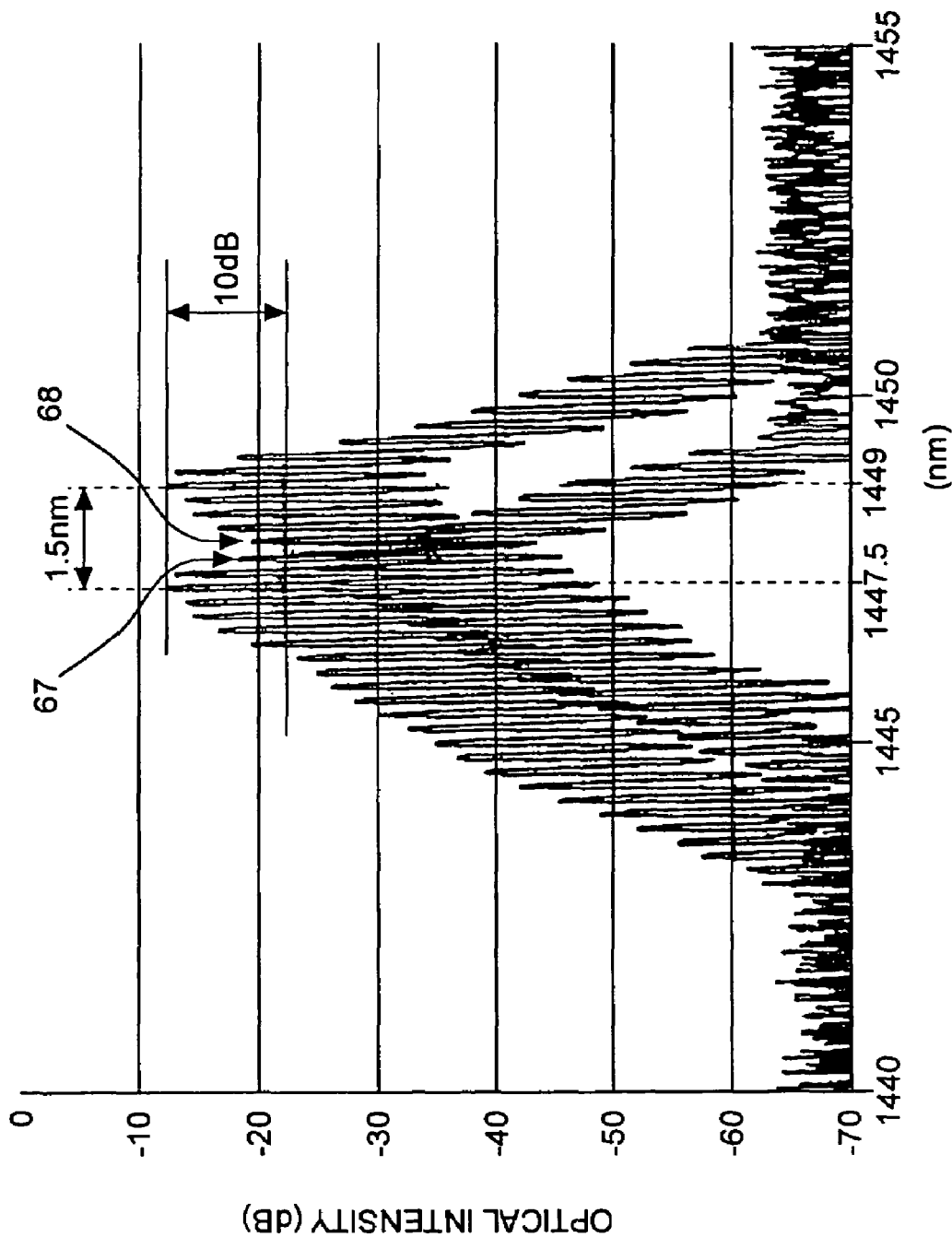
FIG. 19 is a graph of oscillation spectral waveforms of two laser beams having different center wavelengths by 1.5 nm.
Figure 20:
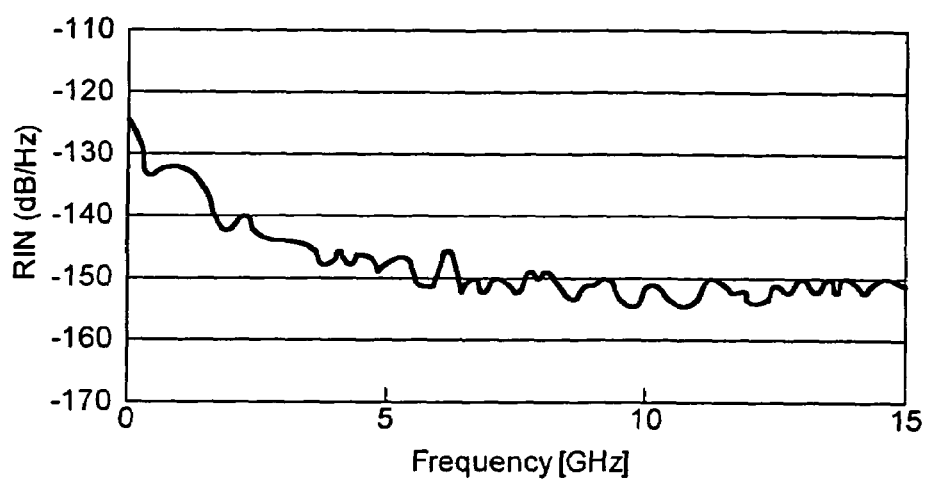
FIG. 20 is a graph of RIN measured for a polarization-combined light that has transmitted over a long distance.
Figure 27:
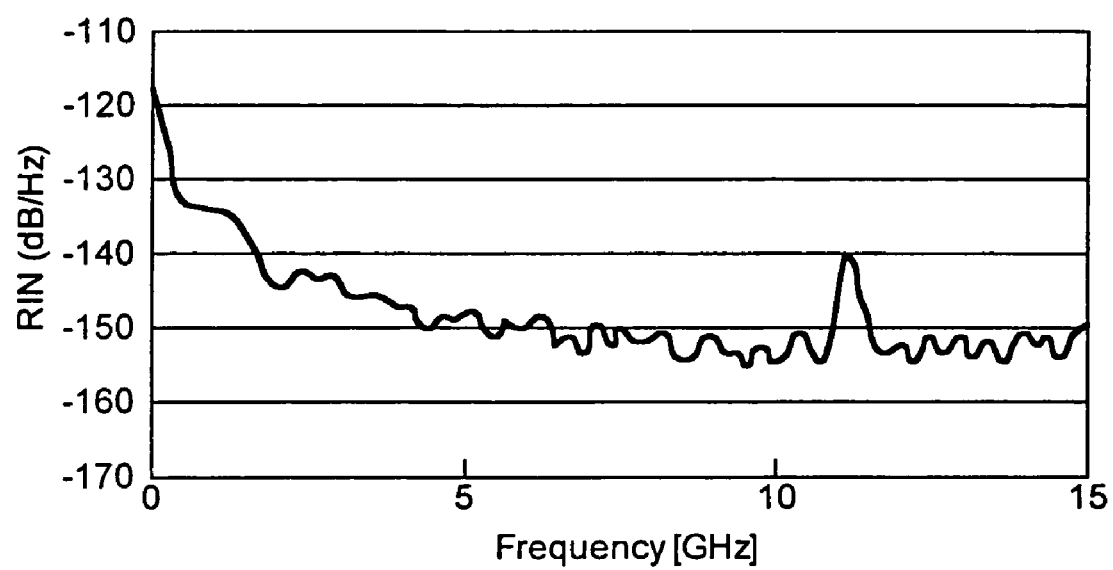
FIG. 27 is a graph illustrating a beat noise generated after propagating a long distance according to a conventional technology.

FIG. 19 is a graph showing waveforms of the laser beams emitted by the two stripes when the wavelength difference Δλp is set to 1.5 nm. In FIG. 19, the laser beam emitted from the first stripe has a center wavelength of 1447.5 nm, and includes the oscillation longitudinal mode 67 whose wavelength is maximum among those longitudinal modes of intensity not more than 10 dB below the maximum intensity. Similarly, the laser beam emitted from the second stripe has a center wavelength of 1449 nm, and includes the oscillation longitudinal mode 68 whose wavelength is minimum among those longitudinal modes of intensity not more than 10 dB below the maximum intensity. The wavelength difference between the oscillation longitudinal mode 67 and the oscillation longitudinal mode 68 is 0.2625 nm, which translates to a frequency difference of 37.6 GHz. For this reason, if a semiconductor laser device having the waveform shown in FIG. 19 is used as the pump light source in Raman amplification, the frequency of the beat noise, which occurs due to mixing of polarization modes during transmission over a long distance, becomes extremely high and therefore does not cause noise in the signal light. FIG. 20 is a graph showing a relative intensity noise in the polarization-combined laser beams after transmitted over a long distance in an optical fiber. It is evident that the peak that appeared around 11 GHz in FIG. 27 is absent in FIG. 20.

Next, a fifth embodiment of the present invention will be described below. A semiconductor laser module according to the fifth embodiment of the present invention uses the semiconductor laser device according to the first embodiment.

Figure 21:
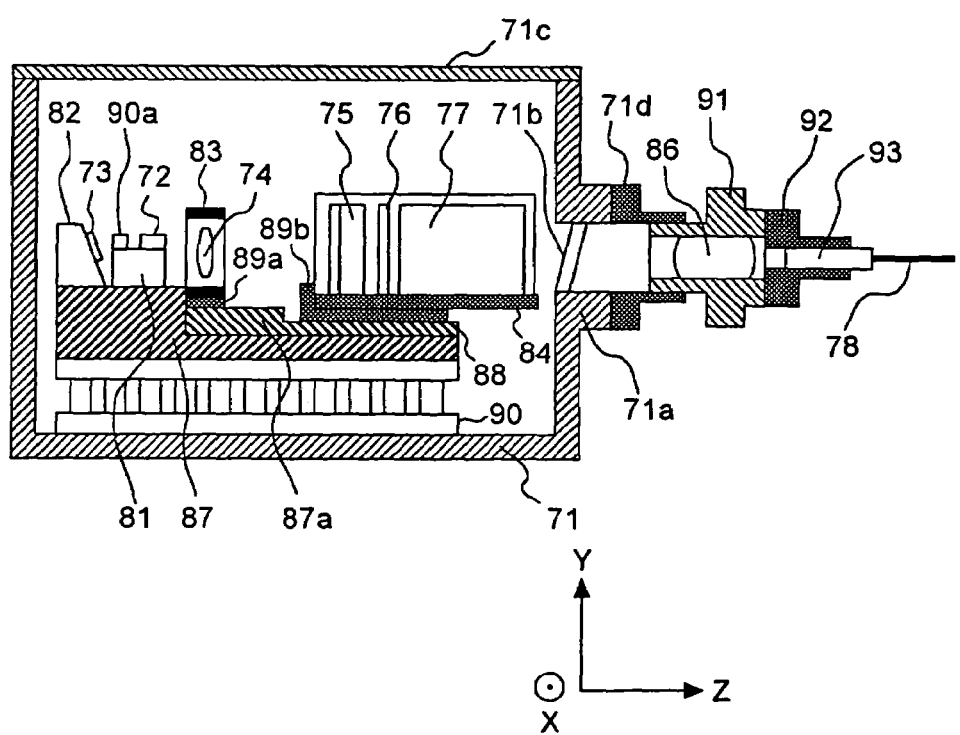
FIG. 21 is a side cross-section of a semiconductor laser module according to a fifth embodiment of the present invention.
Figure 22:
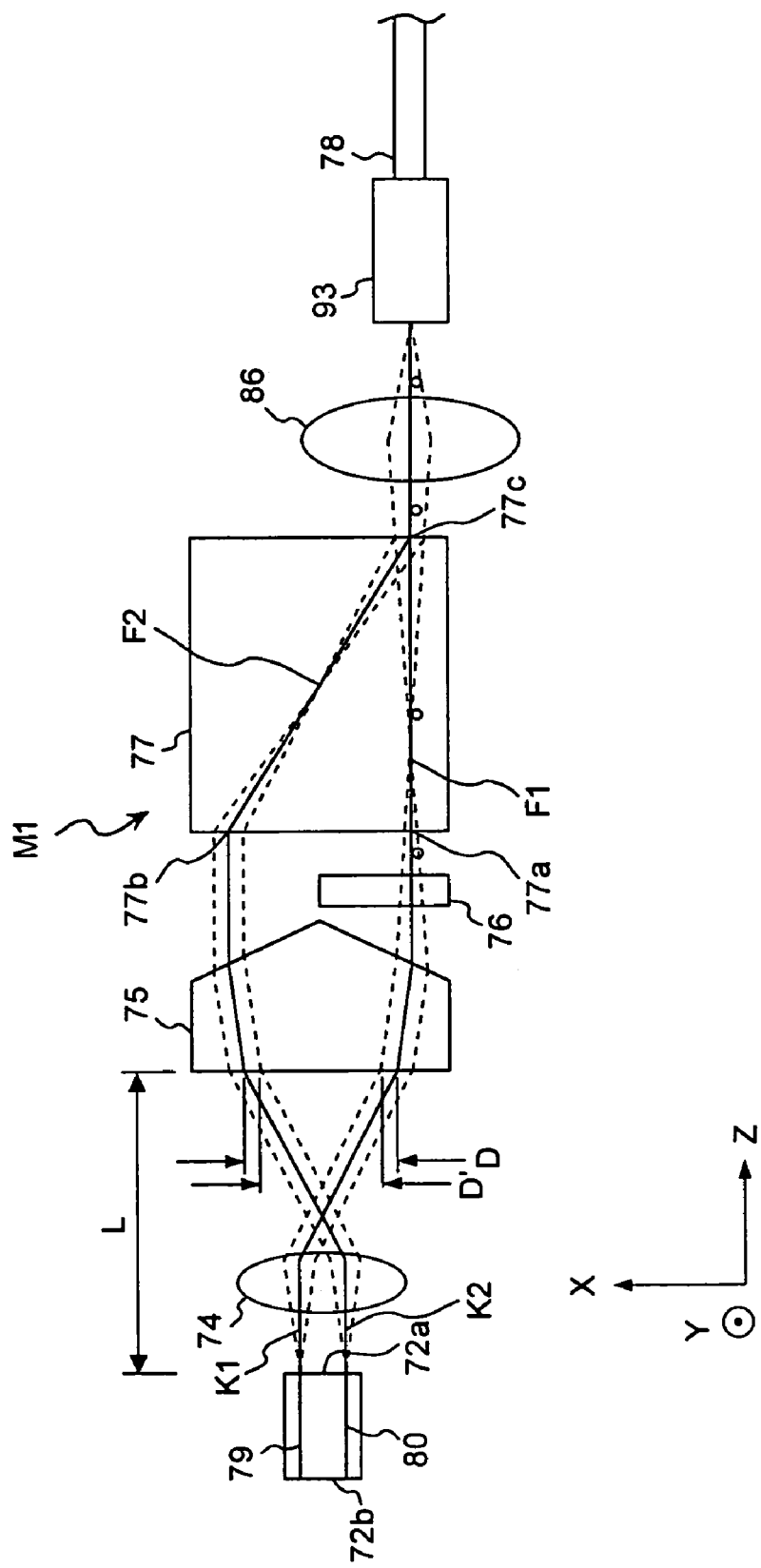
FIG. 22 is a schematic explanatory diagram of the semiconductor laser module according to the fifth embodiment.

FIG. 21 is a side cross-section showing a structure of the semiconductor laser module according to the fifth embodiment, and FIG. 22 is an explanatory diagram schematically showing a structure of the semiconductor laser module according to the fifth embodiment.

As shown in FIG. 21, the semiconductor laser module according to the fifth embodiment has a package 71 with the inside sealed hermetically, a semiconductor laser device 72 that emits a laser beam, a photodiode 73, a first lens 74, a prism 75, a half-wave plate (a polarization rotating unit) 76, and a polarization beam combiner (PBC) 77, all of which are provided inside the package 71, and an optical fiber 78.

As shown in FIG. 22, the semiconductor laser device 72 has a stripe 79 and a stripe 80 that are formed in parallel on the same plane in a longitudinal direction with a distance between the stripes. The stripe 79 and the stripe 80 emit a first laser beam K1 and a second laser beam K2 from their respective end surfaces. In FIG. 22, K1 and K2 show tracks of centers of the beams emitted from the stripe 79 and the stripe 80 respectively. The beams propagate with a certain spread around the centers, as indicated by broken lines in FIG. 22. The distance between the stripe 79 and the stripe 80 is about 40 µm, for example.

The semiconductor laser device 72 is fixed to the upper surface of a chip carrier 81. Alternatively, the semiconductor laser device 72 may be fixed to the upper surface of a heat sink (not shown), which further is fixed to the upper surface of the chip carrier 81.

The photodiode 73 receives a laser beam for monitoring, emitted from a rear end surface 72b (the left side end surface in FIG. 21) of the semiconductor laser device 72. The photodiode 73 is fixed to a photodiode carrier 82.

The first lens 74 receives the first laser beam K1 and the second laser beam K2 emitted from an end surface 72a of a front end surface (the right side end surface in FIG. 21) of the semiconductor laser device 72. The first lens 74 widens the distance between the first laser beam K1 and the second laser beam K2 and focuses the laser beams at different focal points (F1 and F2).

The first lens 74 is held by a first lens holding member 83. Preferably, the first lens 74 is positioned such that the optical axis of the first laser beam K1 emitted from the stripe 79 and the optical axis of the second laser beam K2 emitted from the stripe 80 are substantially symmetric with respect to the center axis of the first lens 74. Based on this arrangement, both of the first laser beam K1 and the second laser beam K2 pass through areas near the center axis of the first lens 74, where the aberrations are small. Therefore, there occurs no disturbance in the wave surfaces of the laser beams, and the optical coupling efficiency to the optical fiber 78 is high. As a result, it is possible to obtain a semiconductor laser module of a higher output. Preferably, the first lens 74 may be an aspheric lens of small spherical aberration, which can suppress the effect of spherical aberration and can augment thereby a coupling efficiency to the optical fiber 78.

The prism 75 is disposed between the first lens 74 and the polarization beam combiner 77 such that the first laser beam K1 and second laser beam K2 are incident thereon and emitted therefrom along their mutually parallel optical axes. The prism 75 is made of an optical glass like BK7 (borosilicated crown glass) or the like. The optical axes of the first and second laser beams K1 and K2, that propagate in non-parallel from the first lens 74, are made parallel based on the refraction of the prism 75. Therefore, it is easy to prepare the polarization beam combiner 77 that is disposed at the back of this prism 75. At the same time, it is easy to downsize the polarization beam combiner 77, and the semiconductor laser module thereby.

Figure 23A:
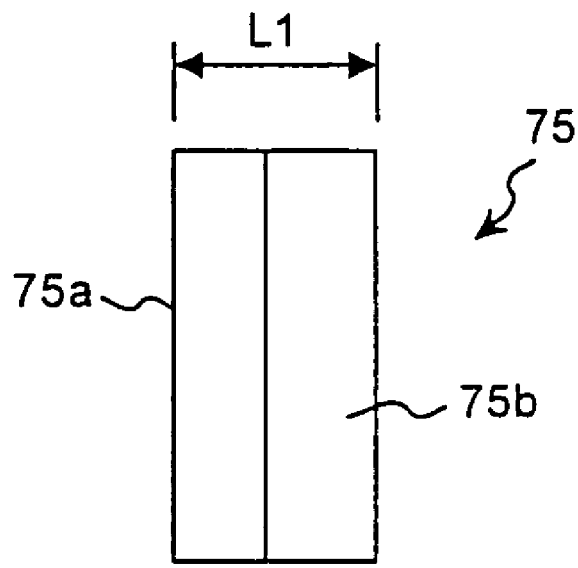
FIG. 23B and FIG. 23B are a side view and a plan view of a prism, respectively.
Figure 23B:
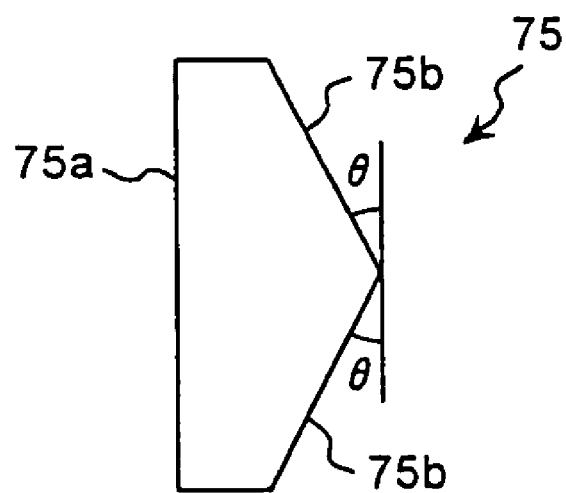

FIG. 23A is a side view showing a structure of the prism 75, and FIG. 23B is a plan view of this prism. As shown in FIG. 23A and FIG. 23B, the prism 75 is about 1.0 mm in total length L1, and has a flat input surface 75a and an output surface 75b inclined at a specific angle θ (θ lies in a range 3.2°±0.1°).

Out of the first laser beam K1 and the second laser beam K2 that have passed through the prism 75, the half-wave plate 76 receives only the first laser beam K1, and rotates its polarization plane by 90°.

The polarization beam combiner 77 has a first port 77a on which the first laser beam K1 is incident, a second port 77b on which the second laser beam K2 is incident, and a third port 77c from which the first laser beam K1 incident on the first port 77a and the second laser beam K2 incident on the second port 77b are combined and emerges. The polarization beam combiner 77 is a birefringent element that transmits the first laser beam K1 to the third port 77c as an ordinary ray, and transmits the second laser beam K2 to the third port 77c as an extraordinary ray. If the polarization beam combiner 77 is made of a birefringent element, TiO$_2$ (rutile), for example, may be used to get a large separation width between the laser beams, because of its large birefringence.

Figure 24A:
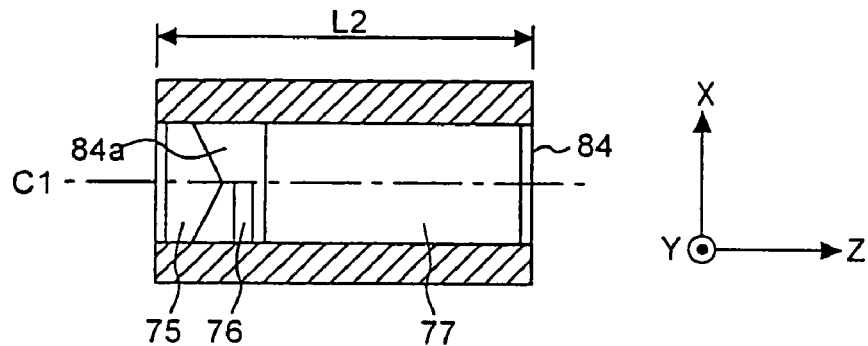
FIG. 24A, FIG. 24B, and FIG. 24C are a plan cross-section, a side cross-section, and a front view of a holder supporting a prism a half-wave plate and a polarization-combining unit, respectively.
Figure 24B:
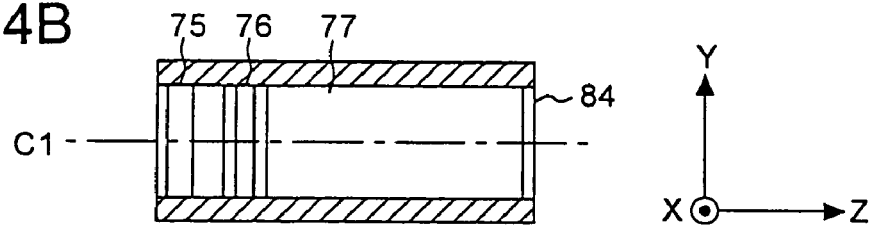
Figure 24C:
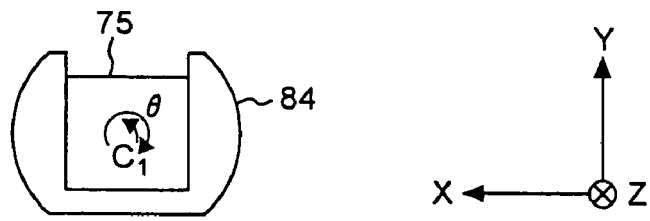

In the present embodiment, the prism 75, the half-wave plate 76, and the polarization beam combiner 77 are fixed to a common holder member 84. FIG. 24A is a plan cross-section showing the holder member 84 supporting the prism 75, the half-wave plate 76, and the polarization beam combiner 77, FIG. 24B is a side cross-section of this holder, and FIG. 24(c) is a front view of this holder. As shown in FIG. 24A, FIG. 24B, and FIG. 24C, the holder member 84 is prepared using a material to which YAG laser welding can be applied (for example, SUS403, 304, and the like). The holder member 84 has a total length L2 of about 7.0 mm, and is substantially cylindrical in shape. The holder member 84 has an accommodating section 84a, where the prism 75, the half-wave plate 76, and the polarization beam combiner 77 are fixed. The upper part and lower part of the holder member 84 are flat.

Figure 24D:
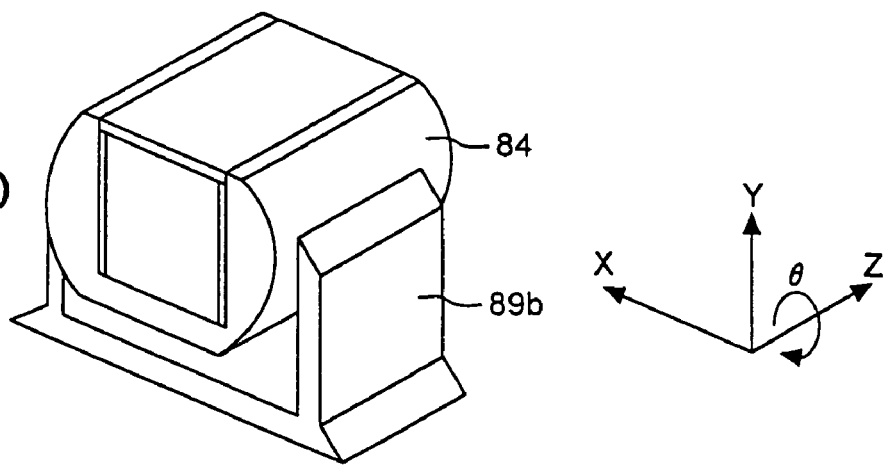

As shown in FIG. 24D, the holder member 84 is fixed between two upright walls of a second supporting member 89b having substantially a U-shaped cross-section. The holder member 84 can be disposed between the upright walls, being rotated around a center axis C1. Based on the above structure, the position of the holder member 84a can be easily adjusted along X, Y, and Z axes and around the center axis C1 such that the first laser beam K1 incident on the first port 77a and the second laser beam K2 incident on the second port 77b of the polarization beam combiner 77 emerges from the third port 77c.

The optical fiber 78 receives the laser beams emerging from the third port 77c of the polarization beam combiner 77, and transmits the laser beams to the outside.

A second lens 86 that optically couples the combined laser beams emerging from the third port 77c of the polarization beam combiner 77 to the optical fiber 78 is disposed between the polarization beam combiner 77 and the optical fiber 78. The first lens 74 is positioned such that the first laser beam K1 and the second laser beam K2 are focused at the focal points (F1 and F2) between the first lens 74 and the second lens 86. With this arrangement, a propagation distance L necessary for the first laser beam K1 and the second laser beam K2., having passed through the first lens 74, to be separated (i.e. a distance D' has a sufficiently large value in FIG. 22) becomes short. Therefore, it becomes possible to shorten the length of the semiconductor laser module in the optical axial direction. As a result, it is possible to provide a highly reliable semiconductor laser module having excellent in time-lapse stability of the optical coupling between the semiconductor laser device 72 and the optical fiber 78 in a high-temperature environment. Besides, since the spot diameters of the laser beams between the first lens 74 and the second lens 86 are small, a compact optical component can be used, thereby making the laser module compact.

The chip carrier 81 to which the semiconductor laser device 72 is fixed, and the photodiode carrier 82 to which the photodiode 73 is fixed, are fixed by soldering onto a first base 87 having substantially an L-shaped cross section. Preferably, the first base 87 is made of a CuW alloy or the like in order to be efficient in radiation of the heat generated by the semiconductor laser device 72.

The first lens holding member 83 to which the first lens 74 is fixed, and the holder member 84 to which the prism 55, the half-wave plate 76, and the polarization beam combiner 77 are fixed, are fixed onto a second base 88 by YAG laser welding via a first supporting member 89a and a second supporting member 89b, respectively. For this purpose, the second base 88 is prepared preferably using a stainless steel or the like of excellent weldability. Further, the second base 88 is fixed onto a flat section 87a of the first base 87 by brazing.

A cooling unit 90 including a Peltier element is provided on the lower portion of the first base 87. A thermistor 90a provided on the chip carrier 81 detects a rise in temperature due the heat generated by the semiconductor laser device 72. The cooling unit 90 controls the temperature detected by the thermistor 90a to a constant temperature. Based on this, it is possible to increase and stabilize the laser beams output from the semiconductor laser device 72.

A window section 71b on which the beam that has passed through the polarization beam combiner 77 is incident, is provided inside a flange section 71a formed at a side of the package 71. An intermediate member 71d is fixed to the end surface of the flange section 71a. A second lens holding member 91 holding the second lens 86 for focusing the laser beam is fixed to the inside of the intermediate member 71d by YAG welding. A ferrule 93 holding the optical fiber 78 is fixed to the end of the second lens holding member through a metal slide ring 92 by YAG welding.

The operation of the semiconductor laser module according to the fifth embodiment will be explained below. The first laser beam K1 and the second laser beam K2 emitted from the front end surfaces 72a of the stripe 79 and the stripe 80 of the semiconductor laser device. 72, respectively, pass through the first lens 74. Thereafter, the first laser beam K1 and the second laser beam K2 cross each other so that the distance between these beams is widened, and the beams are incident on the prism 75. The distance (D) between the first laser beam K1 and the second laser beam K2 at the incidence on the prism 55 is about 480 µm. The first laser beam K1 and the second laser beam K2 are made parallel to each other by the prism 75 and emerge from the prism 75 (the distance between the beams at this point is about 500 µm). Thereafter, the first laser beam K1 is incident on the half-wave plate 76, where the polarization plane is rotated by 90°, and then is incident on the first port 77a of the polarization beam combiner 77, while the second laser beam K2 is incident on the second port 77b of the polarization beam combiner 77.

The polarization beam combiner 77 combines the first laser beam K1 incident on the first port 77a and the second laser beam K2 incident on the second port 77b, and the combined beams emerge from the third port 77c.

The second lens 86 focuses the laser beams emerging from the polarization beam combiner 77. The focused beams are incident on the end surface of the optical fiber 78 supported by the ferrule 93, and are transmitted to the outside.

On the other hand, the photodiode 73 receives, for monitoring, the laser beam emitted from the rear end surface 72b of the semiconductor laser device 72. The optical output etc. is adjusted by controlling the operating current to the semiconductor laser device 72, based on the intensity of received light at the photodiode 73.

In the semiconductor laser module according to the fifth embodiment, the semiconductor laser device 72 emits the first laser beam K1 and the second laser beam K2, which are polarization-combined through the half-wave plate 76 which rotates the polarization plane of the first laser beam K1 by 90°, and the polarization beam combiner 77 which polarization-combines the first laser beam K1 and the second laser beam K2. Therefore, the laser beams of high output and with small degree of polarization can be obtained from the optical fiber 78, and hence, it is possible to apply the above semiconductor laser module as for use an pump light source for the energy-doped optical fiber amplifier that requires a high output, and the Raman amplifier that additionally requires a low polarization dependency and wavelength stability.

In the fifth embodiment, the semiconductor laser module is structured using the semiconductor laser device according to the first embodiment. However, the structure is not limited to this. For example, a semiconductor laser device having a wavelength selecting unit like the DFB and the DBR, or the semiconductor laser device according to the second to fourth embodiments may be used. Rather, these semiconductor laser devices are preferable since they eliminate the need of fiber gratings when being used in optical fiber amplifiers.

Figure 25:
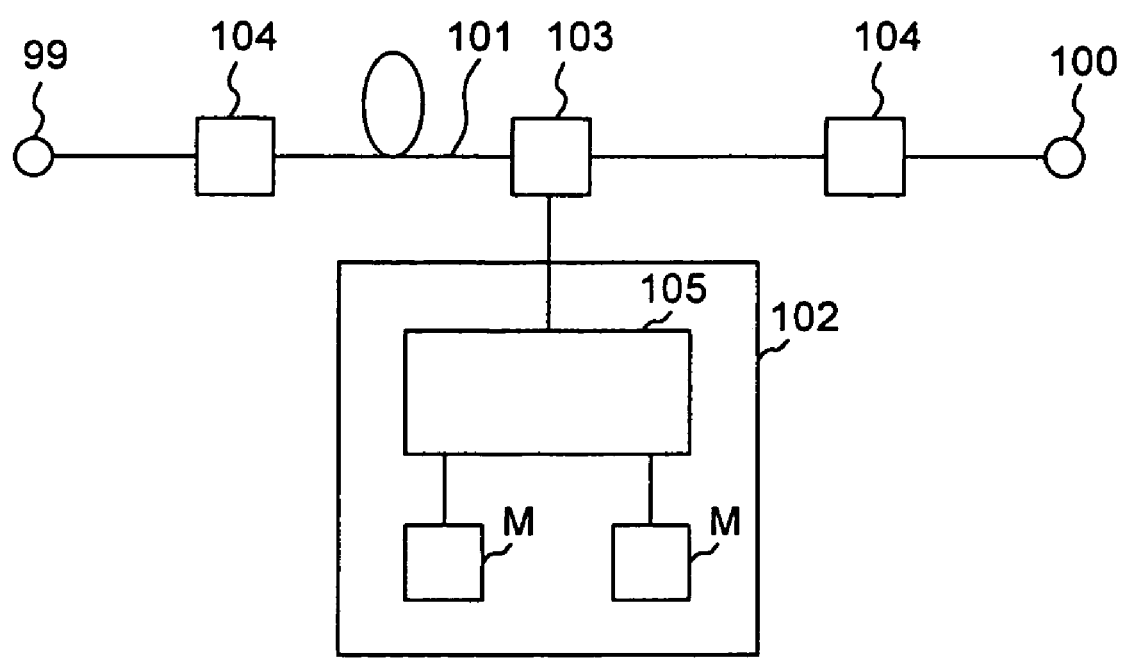
FIG. 25 is a block diagram of an optical fiber amplifier according to a sixth embodiment of the present invention.
Figure 26:
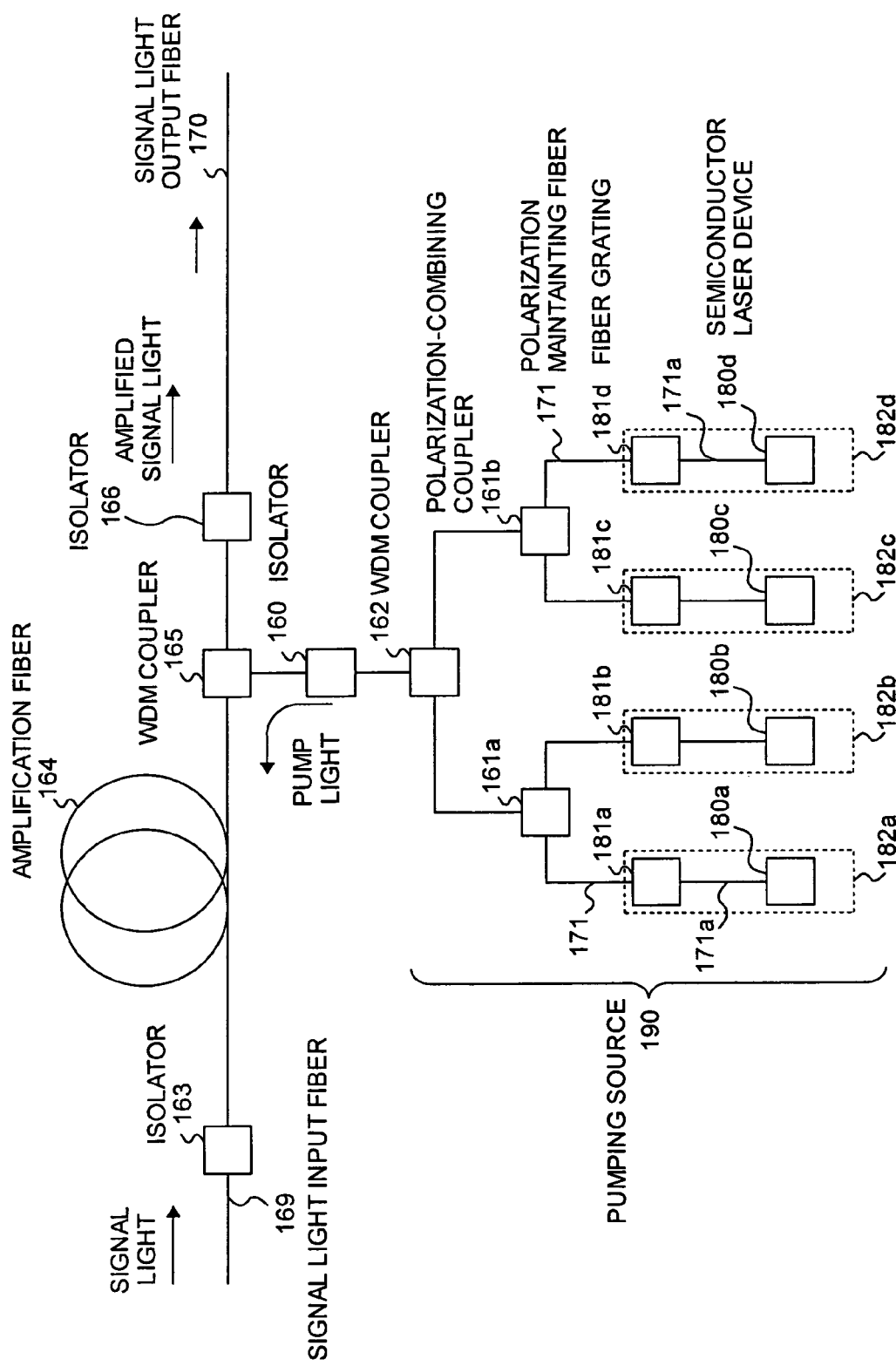
FIG. 26 is a block diagram of a conventional optical fiber amplifier.

Next, an optical fiber amplifier according to a sixth embodiment of the present invention will be described below. The optical fiber amplifier according to the sixth embodiment of the present invention carries out an optical amplification based on a Raman amplification. FIG. 25 is a block diagram showing a configuration of the optical fiber amplifier according to the sixth embodiment.

As shown in FIG. 25, the optical fiber amplifier according to the sixth embodiment has an input section 99 to which an signal light is input, an output section 100 from which the signal light is output, an optical fiber (an amplification fiber) 101 that transmits the signal light between the input section 99 and the output section 100, a pump light generating section 102 that generates an pump light, and a WDM coupler 103 that combines the pump light generated by the pump light generating section 102 and the signal light transmitted in the optical fiber (an amplification fiber) 101.

An optical isolator 104 is provided between the input section 99 and the WDM coupler 103, and between the output section 100 and the WDM coupler 103, respectively, allowing only the signal light in the direction from the input section 99 to the output section 100.

The pump light generating section 102 includes two of semiconductor laser module M according to the fifth embodiment, emitting laser beams of different wavelength bands, and a WDM coupler 105 that combines the laser beams emitted from the semiconductor laser modules M.

The pump lights emitted from the semiconductor laser modules M are combined by the WDM coupler 105, and constitute an output beam of the pump light generating section 102.

The pump light generated by the pump light generating section 102 are coupled to the optical fiber 101 by the WDM coupler 103. The signal light input from the input section 99 is combined with pump light in the optical fiber 101, whereby the signal lights are Raman-amplified. The amplified signal lights pass through the WDM coupler 103, and are output from the output section 100.

In the optical fiber amplifier according to the sixth embodiment, it is possible to lower the DOP by using the semiconductor laser module according to the fifth embodiment, whereby, a stable and high-gain optical amplification can be carried out irrespective of the polarization direction of the signal light.

Further, according to the sixth embodiment, by adopting a W stripe structure in the semiconductor laser device, the optical fiber amplifier can be manufactured easily and can be downsized as well.

As explained above, according to the present invention, a semiconductor laser device having a W stripe structure has a non-current-injection area on the upper surface of one of the stripes. Therefore, the lengths of resonators on the two stripes are substantially different. Consequently, the oscillation longitudinal mode wavelengths and their spacing are different in the first laser beam and the second laser beam. As a result, the oscillation longitudinal modes of the two laser beams do not overlap which leads to reduction of the DOP.

According to the next invention, the surface areas of the non-current-injection areas in the first stripe and the second stripe differ. Consequently, the oscillation longitudinal mode wavelengths of the., laser beams from the two stripe structures are different, leading to reduction of the DOP.

According to the next invention, the non-current-injection area is formed as an area where the electrode is not disposed. Consequently, it is possible to form a non-current-injection area easily.

According to the next invention, the partially provided diffraction gratings enable to select laser beams having a specific center wavelength and including a plurality of oscillation longitudinal modes. In this situation, by providing a non-current-injection area, it is possible to make the first stripe structure and the second stripe structure to oscillate in different longitudinal modes.

According to the next invention, the first diffraction grating is disposed in an area below the non-current-injection area. Therefore, there is no flow of current and a resultant variation of refractive index in the first diffraction grating, which reduces the variation of the center wavelength selected by the first diffraction grating.

According to the next invention, the temperature in the first active layer and the temperature in the second active layer are made to differ by varying the thermal conduction efficiency. Consequently, the oscillation longitudinal mode wavelength of the first laser beam and the oscillation longitudinal mode wavelength of the second laser beam can be different so that the overlapping of the two oscillation longitudinal modes are suppressed, whereby the DOP can be reduced.

According to the next invention, diffraction gratings provided enable to emit a first laser beam and a second laser beam having a specific center wavelength and including a plurality of oscillation longitudinal modes. In this situation, by varying thermal conduction efficiency in the first stripe structure and the second stripe structure, it is possible make the stripes to oscillate at different longitudinal mode wavelengths.

According to the next invention, the width of the stripe structure in the lateral direction is made to differ in the first stripe and the second stripe so that the thermal conduction efficiencies are different in the first stripe and the second stripe.

According to the next invention, the distance between the active layer and the electrode is made to differ in the first stripe and the second stripe so that the thermal conduction efficiencies are different in the first stripe and the second stripe.

According to the next invention, the distance between the active layer and the electrode is made to differ in the first stripe and the second stripe by varying the film thickness of the clad layer so that the thermal conduction efficiencies are different in the first stripe and the second stripe.

According to the next invention, the structures of the diffraction grating of the first stripe and the second stripe differ so that the center wavelengths selected by the first stripe and the center wavelength selected by the second stripe are different.

According to the next invention, the period of the diffraction grating in each stripe is made to differ so that the center wavelength selected by each stripe is different.

According to the next invention, the difference between the center wavelength of the first laser beam and the center wavelength of the second laser beam is not less than 0.5 times the wavelength spacing between the adjoining oscillation longitudinal modes of the first laser beam and the second laser beam. Consequently, the DOP of the combined light can be reduced, irrespective of whether the oscillation longitudinal modes of the laser beams emitted from the two stripes overlap or not.

According to the next invention, the difference between the center wavelength of the first laser beam and the center wavelength of the second laser beam is not less than 1.5 times the wavelength spacing between the adjoining oscillation longitudinal modes of the first laser beam and the second laser beam. This has the effect of being able to reduce the DOP of the combined light to 10% or lower, irrespective of whether the oscillation longitudinal modes of the laser beams emitted from the two stripes overlap or not.

According to the next invention, the difference between the center wavelength of the first laser beam and the center wavelength of the second laser beam is not less than 5 times the wavelength spacing between the adjoining oscillation longitudinal modes of the first laser beam and the second laser beam. This has the effect of being able to reduce the DOP of the combined light to 5% or lower, irrespective of whether the oscillation longitudinal modes of the laser beams emitted from the two stripes overlap or not.

According to the next invention, the difference between the peak wavelength of the first laser beam and the peak wavelength of the second laser beam is not less than 0.01 nm. Consequently, the overlapping of two oscillation longitudinal modes is suppressed, whereby the DOP can be reduced.

According to the next invention, the difference between two oscillation longitudinal modes above a specific intensity is not less than 0.01 nm. Consequently, the overlapping of two oscillation longitudinal modes is suppressed, whereby the DOP can be reduced.

According to the next invention, the difference is not less than 0.1 nm. Consequently, the overlapping of two oscillation longitudinal modes is suppressed, whereby the DOP can be reduced.

According to the next invention, the two oscillation wavelength spectrums do not cross each other on the portions above a specific intensity. Consequently, even if oscillation longitudinal modes overlap, the intensity of these oscillation longitudinal modes are small. As a result, it is possible to reduce the DOP.

According to the next invention, the oscillation longitudinal modes above a specific intensity of the first laser beam and of the second laser beam have a frequency difference not less than a specific value. It has the effect of being able to suppress the beat noise, or even if the beat noise does occur, it can be outside the frequency band of the optical transmission system to which the semiconductor laser device is used.

According to the next invention, the first laser beam and the second laser beam emitted from the semiconductor laser device are polarization-combined, and the polarization-combined beam is output to the optical fiber. This has the effect of being able to emit a laser beam of a reduced DOP.

According to the next invention, a single lens is used to separate the first laser beam and the second laser beam so as to widen the distance between the two laser beams. Since the two laser beams are first separated and then polarization-combined, it is easy to design and assemble the parts required for polarization-combining the two laser beams emitted from these stripes, even if the stripes are close to each other.

According to the next invention, it is possible to provide an optical fiber amplifier with reduced polarization dependency of gain, using the above semiconductor laser device or semiconductor laser module.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

INDUSTRIAL APPLICABILITY

The semiconductor laser device, the semiconductor laser module, and the optical fiber amplifier using the semiconductor laser module according to the present invention are suitable for a pumping source for Raman amplification, and suitable for realizing stable and high-gain amplification to be used in an optical transmission system.

The invention claimed is:

1. A semiconductor laser device comprising:
a first stripe structure that has a first active layer grown on a first portion of a semiconductor substrate and a first diffraction grating formed in a vicinity of the first active layer, said first stripe structure configured to emit a first laser beam having a plurality of oscillation longitudinal modes with a first center wavelength selected by the first diffraction grating; and a second stripe structure that has a second active layer grown on a second portion of the semiconductor substrate and a second diffraction grating formed in a vicinity of the second active layer, said second stripe structure configured to emit a second laser beam having a plurality of oscillation longitudinal modes with a second center wavelength selected by the second diffraction grating, wherein
the first center wavelength differs from the second center wavelength, and wherein
an oscillation wavelength spectrum formed by the oscillation longitudinal modes belonging to the first laser beam and an oscillation wavelength spectrum formed by the oscillation longitudinal modes belonging to the second laser beam do not cross each other in a range in which the intensity difference with respect to a peak power is not more than 3 dB.

2. A semiconductor laser device comprising:
a first stripe structure that has a first active layer grown on a first portion of a semiconductor substrate and a first diffraction grating formed in a vicinity of the first active layer, said first stripe structure configured to emit a first laser beam having a plurality of oscillation longitudinal modes with a first center wavelength selected by the first diffraction grating; and
a second stripe structure that has a second active layer grown on a second portion of the semiconductor substrate and a second diffraction grating formed in a vicinity of the second active layer, said second stripe structure configured to emit a second laser beam having a plurality of oscillation longitudinal modes with a second center wavelength selected by the second diffraction grating, wherein
the first center wavelength differs from the second center wavelength, and wherein
the second center wavelength is shorter than the first center wavelength, and
a frequency difference between the oscillation longitudinal mode having a minimum wavelength among the oscillation longitudinal modes of intensity not more than 10 dB below a peak power in the first laser beam and the oscillation longitudinal mode having a maximum wavelength among the oscillation longitudinal modes of intensity not more than 10 dB below a peak power in the second laser beam is greater than an electrical frequency bandwidth of an optical transmission system being used.

3. A semiconductor laser device comprising:
a first stripe structure that has a first active layer grown on a first portion of a semiconductor substrate, said first stripe structure configured to emit a first laser beam having a plurality of oscillation longitudinal modes; and
a second stripe structure that has a second active layer grown on a second portion of the semiconductor substrate, said second stripe structure configured to emit a second laser beam having a plurality of oscillation longitudinal modes, wherein
a wavelength difference between all the oscillation longitudinal modes of intensity not more than 3 dB below a peak power of the first laser beam and all the oscillation longitudinal modes of intensity not more than 3 dB below a peak power of the second laser beam is not less than 0.01 nm.

4. The semiconductor laser device according to claim 3, wherein the wavelength difference is not less than 0.1 nm.

5. A semiconductor laser module comprising:
a semiconductor laser device including
  a first stripe structure that has a first active layer grown on a first portion of a semiconductor substrate, said first stripe structure configured to emit a first laser beam having a plurality of oscillation longitudinal modes; and
  a second stripe structure that has a second active layer grown on a second portion of the semiconductor substrate, said second stripe structure configured to emit a second laser beam having a plurality of oscillation longitudinal modes, wherein a wavelength difference between all the oscillation longitudinal modes of intensity not more than 3 dB below a peak power of the first laser beam and all the oscillation longitudinal modes of intensity not more than 3 dB below a peak power of the second laser beam is not less than 0.01 nm;
a first lens on which the first laser beam and the second laser beam are incident;
a polarization rotating unit on which either of the first laser beam and the second laser beam emerging from the first lens is incident, said polarization rotating unit being configured to rotate the polarization plane of the incident laser beam by a predetermined angle;
a polarization-combining unit including a first port on which the first laser beam emerging from either of the first lens and the polarization rotating unit is incident, a second port on which the second laser beam emerging from either of the polarization rotating unit and the first lens is incident, and a third port from which the first laser beam and the second laser beam emerge as a combined laser beam; and
an optical fiber that receives the combined laser beam emerging from the third port of the polarization-combining unit, and transmits the combined laser beam to outside.

6. The semiconductor module according to claim 5, wherein the first lens is a single lens configured to separate the first laser beam and the second laser beam so as to widen a distance therebetween.

7. An optical fiber amplifier comprising:
a pump light source generating a pump light of reduced degree of polarization by polarization combining a first laser beam and a second laser beam emitted from a semiconductor laser device, said semiconductor laser device including
  a first stripe structure that has a first active layer grown on a first portion of a semiconductor substrate, said first stripe structure configured to emit the first laser beam having a plurality of oscillation longitudinal modes; and
  a second stripe structure that has a second active layer grown on a second portion of the semiconductor substrate, said second stripe structure configured to emit the second laser beam having a plurality of oscillation longitudinal modes, wherein a wavelength difference between all the oscillation longitudinal modes of intensity not more than 3 dB below a peak power of the first laser beam and all the oscillation longitudinal modes of intensity not more than 3 dB below a peak power of the second laser beam is not less than 0.01 nm;
an optical coupler that couples a signal light with the pump light; and
an amplification optical fiber that amplifies the signal light based on a Raman amplification.

* * * * *